(12) United States Patent
Phan Thanh et al.

(10) Patent No.: US 10,412,846 B1
(45) Date of Patent: Sep. 10, 2019

(54) ELECTRONIC DEVICE AND HOUSING STRUCTURE USED IN THE SAME

(71) Applicant: Samsung Electronics Co., Ltd., Gyeonggi-do (KR)

(72) Inventors: Hai Phan Thanh, Thai Binh (VN); Linh Ngo Van, Thanh Hoa (VN); Anh Nguyen Tuan, Bac Giang (VN); Cuong Nguyen Xuan, Ha Noi (VN); Doan Tran Van, Hung Yen (VN)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/190,985

(22) Filed: Nov. 14, 2018

(30) Foreign Application Priority Data

Aug. 8, 2018 (KR) .......................... 10-2018-0092682

(51) Int. Cl.
*G06F 1/16* (2006.01)
*H04M 1/02* (2006.01)
(Continued)

(52) U.S. Cl.
CPC ............. *H05K 5/04* (2013.01); *G06F 1/1637* (2013.01); *H04M 1/0266* (2013.01);
(Continued)

(58) Field of Classification Search
CPC .... G06F 1/1626; G06F 1/1637; G06F 1/1656; G06F 2200/1633; H04M 1/0249; H04M 1/0266; H04M 1/185
See application file for complete search history.

(56) References Cited

U.S. PATENT DOCUMENTS

| 3,789,606 A * | 2/1974 | Isono ................... G04B 39/02 368/291 |
| 6,064,453 A * | 5/2000 | Inubushi .......... G02F 1/133308 349/58 |

(Continued)

FOREIGN PATENT DOCUMENTS

| KR | 20140031491 A | * | 3/2014 | .......... H04M 1/0266 |
| KR | 20180039522 A | * | 4/2018 | .......... H04M 1/0249 |

OTHER PUBLICATIONS

Korean Office Action dated Apr. 26, 2019 issued in counterpart application No. 10-2018-0092682, 11 pages.

*Primary Examiner* — Adrian S Wilson
(74) *Attorney, Agent, or Firm* — The Farrell Law Firm, P.C.

(57) ABSTRACT

An electronic device and a housing structure thereof are provided. The electronic device includes a transparent member; a metallic housing surrounding a boundary of the transparent member, and forming a lateral outer appearance of the electronic device; and a non-metallic absorption member arranged inside the metallic housing. The non-metallic absorption member is arranged to face a side surface of the transparent member. The metallic housing comprises a protection portion arranged adjacent to the boundary of the transparent member. An interlace between the non-metallic absorption member and the protection portion, which faces the transparent member, is disposed inward relative to a first virtual extension line virtually extending along an external surface of the transparent member. An inner surface of the protection portion facing the non-metallic absorption member includes a surface inclined at a preset angle with respect to a front or rear direction of the electronic device.

20 Claims, 19 Drawing Sheets

(51) Int. Cl.
*H05K 5/04* (2006.01)
*H05K 5/03* (2006.01)
*H05K 5/00* (2006.01)

(52) U.S. Cl.
CPC ............ *H05K 5/0017* (2013.01); *H05K 5/03* (2013.01); *G06F 2200/1633* (2013.01)

(56) References Cited

U.S. PATENT DOCUMENTS

| | | | | |
|---|---|---|---|---|
| 6,437,238 | B1* | 8/2002 | Annerino | G06F 1/1626 174/50 |
| 8,238,087 | B2* | 8/2012 | McClure | G06F 1/1613 248/178.1 |
| 8,254,098 | B2* | 8/2012 | Liu | H04M 1/0249 174/50 |
| 8,531,834 | B2* | 9/2013 | Rayner | H01H 13/06 361/679.56 |
| 10,148,000 | B2* | 12/2018 | Hill | H01Q 1/243 |
| 2007/0081303 | A1* | 4/2007 | Lam | G06F 1/1626 361/679.4 |
| 2007/0158220 | A1* | 7/2007 | Cleereman | A45C 11/00 206/320 |
| 2009/0257207 | A1* | 10/2009 | Wang | G06F 1/1626 361/752 |
| 2009/0296325 | A1* | 12/2009 | Morimoto | H04M 1/185 361/679.01 |
| 2010/0014232 | A1* | 1/2010 | Nishimura | B29C 45/14073 361/679.3 |
| 2010/0061040 | A1* | 3/2010 | Dabov | G06F 1/1626 361/679.01 |
| 2010/0061044 | A1* | 3/2010 | Zou | B32B 3/02 361/679.01 |
| 2010/0203931 | A1* | 8/2010 | Hynecek | A45C 11/00 455/575.8 |
| 2011/0050054 | A1* | 3/2011 | Chang | H04M 1/0266 312/223.1 |
| 2011/0255218 | A1* | 10/2011 | Pakula | G06F 1/1626 361/679.01 |
| 2012/0118628 | A1* | 5/2012 | Pakula | G06F 1/1626 174/520 |
| 2012/0329535 | A1* | 12/2012 | Kuo | A45C 11/00 455/575.8 |
| 2013/0021280 | A1* | 1/2013 | Dabov | G06F 1/1626 345/173 |
| 2013/0098546 | A1* | 4/2013 | Racine | G04G 17/045 156/272.8 |
| 2013/0328462 | A1* | 12/2013 | Pakula | G06F 1/1626 312/223.1 |
| 2014/0063705 | A1 | 3/2014 | Song | |
| 2015/0070825 | A1* | 3/2015 | Perko | G04G 17/045 361/679.26 |
| 2017/0196112 | A1* | 7/2017 | Pakula | G06F 1/1626 |
| 2018/0343332 | A1 | 11/2018 | Kim et al. | |

* cited by examiner

A-A

B-B

C-C

ELECTRONIC DEVICE AND HOUSING STRUCTURE USED IN THE SAME

CROSS-REFERENCE TO RELATED APPLICATION(S)

This application is based on and claims priority under 35 U.S.C. § 119 to Korean Patent Application No. 10-2018-0092682, filed on Aug. 8, 2018, in the Korean Intellectual Property Office, the disclosure of which is incorporated herein by reference in its entirety.

BACKGROUND

1. Field

The present disclosure relates generally to an electronic device and a housing structure of the electronic device.

2. Description of Related Art

An electronic device may include a display module that outputs a screen at a front surface of the electronic device, window glass protecting the display module, and a housing surrounding a boundary of the window glass. The electronic device may also include a rear case arranged on the rear of the housing and rear glass arranged on the rear of the rear case to provide an aesthetic sense to a rear surface of the electronic device.

While the electronic device as described above is becoming thinner and more lightweight, the electronic device is still required to have a certain strength.

The housing, which is mostly responsible for the outer appearance of the electronic device, may be formed of a metallic material to fulfill the requirements regarding the outer appearance characteristics and strength characteristics of the electronic device.

However, due to external impacts, there is a possibility that cracks may still be generated in the window glass or the rear glass of the electronic device or a possibility of other damage to the electronic device.

SUMMARY

Accordingly, an aspect of the present disclosure is to provide an electronic device with an aesthetic sense and in which cracks or damage to window glass or rear glass of the electronic device may be prevented, and a housing structure used in the electronic device.

In accordance with an aspect of the disclosure, an electronic device is provided, which includes a transparent member arranged on at least one of a front surface and a rear surface of the electronic device; a metallic housing surrounding a boundary of the transparent member, and forming a lateral outer appearance of the electronic device; and a non-metallic absorption member arranged inside the metallic housing. At least a portion of the non-metallic absorption member is arranged to face a side surface of the transparent member. The metallic housing comprises a protection portion arranged adjacent to the boundary of the transparent member. A portion of an interface between the non-metallic absorption member and the protection portion, which faces the transparent member, is disposed inward relative to a first virtual extension line virtually extending along an external surface of the transparent member. An inner surface of the protection portion facing the non-metallic absorption member includes a surface inclined at a preset angle with respect to a front or rear direction of the electronic device.

In accordance with another aspect of the disclosure, a housing structure is provided for an electronic device including a transparent member arranged on at least one of a front surface and a rear surface of the electronic device. The housing structure includes a metallic boundary of the transparent member, forming a lateral outer appearance of the electronic device; and a non-metallic absorption member arranged inside the housing structure. At least a portion of the non-metallic absorption member is arranged to face a side surface of the transparent member. A portion of the metallic boundary comprises a protection portion arranged adjacent to a boundary of the transparent member. A portion of the interface between the non-metallic absorption member and the protection portion, which faces the transparent member, is disposed inward relative to a first virtual extension line virtually extending along an external surface of the transparent member. An inner surface of the protection portion facing the non-metallic absorption member includes a surface inclined at a preset angle with respect to a front or rear direction of the electronic device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
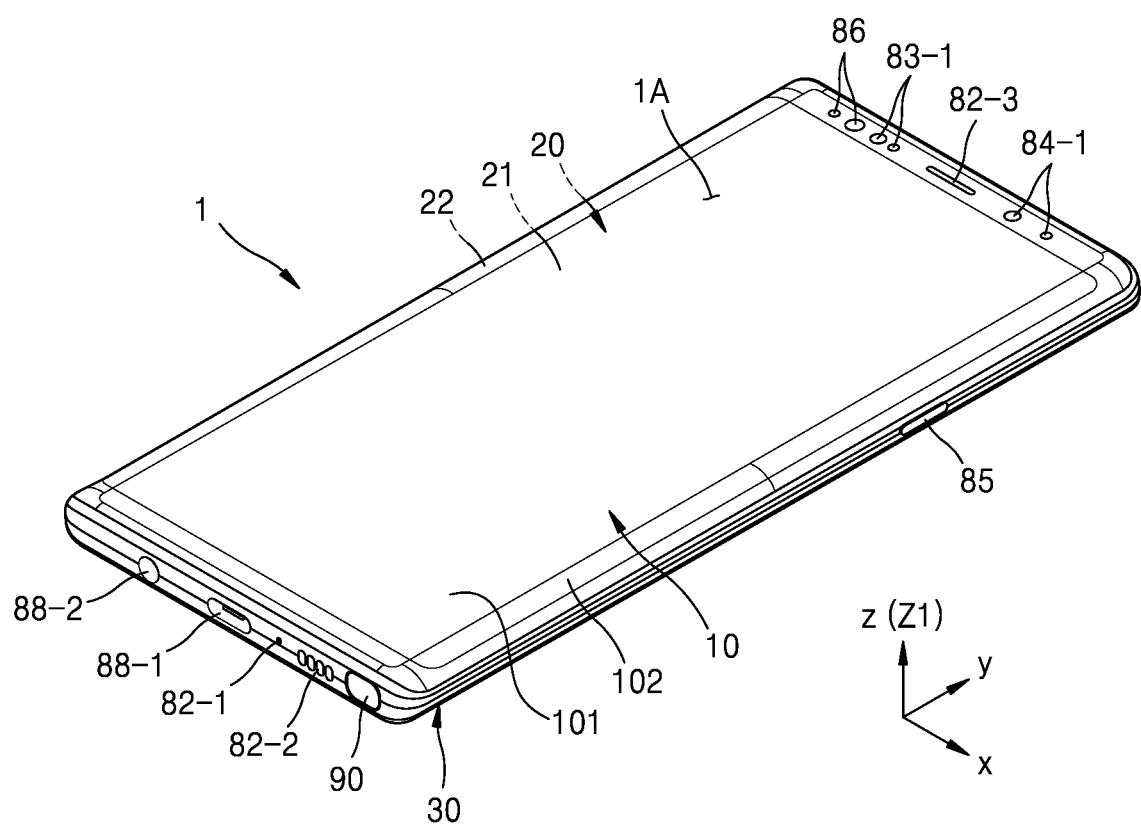
FIGS. 1A and 1B illustrate perspective views of an electronic device according to an embodiment.

Various embodiments of the present disclosure will now be described in detail with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure.

In addition, descriptions of well-known functions and constructions are omitted for clarity and conciseness.

The terms used in this specification are those general terms currently widely used in the art in consideration of functions in regard to the disclosure, but may vary according to the intention of those of ordinary skill in the art, precedents, or new technology in the art. Also, specified terms may be selected by the applicant, and in this case, the detailed meaning thereof will be described in the detailed description of the disclosure. Thus, the terms used in the specification should be understood not as simple names, but based on the meaning of the terms and the overall description of the disclosure.

Throughout the specification, when a portion "includes" an element, another element may be further included, rather than excluding the existence of the other element, unless otherwise described.

While numerical terms, such as "first," "second," etc., may be used to describe various elements, such elements must not be limited to the above terms. As used herein, the terms "1st" or "first" and "2nd" or "second" may use corresponding components regardless of importance or order and are used to distinguish one component from another without limiting the components.

An electronic device according to an embodiment of the disclosure may include a smartphone, a tablet personal computer (PC), a mobile phone, a video phone, an e-book reader, a desktop PC, a laptop PC, a netbook computer, a workstation, a server, a personal digital assistant (PDA), a portable multimedia player (PMP), an MP3 player, a mobile medical device, a camera, and/or a wearable device (e.g., smartglasses, a head-mounted-device (HMD), electronic clothing, an electronic bracelet, an electronic necklace, an electronic appcessory, an electronic tattoo, a smart mirror, or a smart watch).

An electronic may also include a smart hone appliance, such as a television (TV), a digital video disk (DVD) player, a stereo system, a refrigerator, an air conditioner, a vacuum cleaner, an oven, an electric range, a washing machine, an air cleaner, a set-top box, a home automation control panel, a security control panel, a TV box (e.g., Samsung Home-Sync™, Apple TV™, or Google TV™), a game console (e.g., Xbox™ or PlayStation™), an electronic dictionary, an electronic key, a camcorder, and/or an electronic frame.

An electronic device may also include a medical device (e.g., a portable medical measurement device, such as a blood glucose meter, a cardiotachometer, a blood pressure meter, or a temperature meter, a magnetic resonance angiography (MRA) device, a magnetic resonance imaging (MRI) device, a computed tomography (CT) device, an imaging device, or an ultrasonic device), a navigation device, a global positioning system (GPS) receiver, an event data recorder (EDR), a flight data recorder (FDR), a vehicle infotainment device, electronic equipment for ships (e.g., a marine navigation system, a gyrocompass, etc.), avionics, a security device, head units for vehicles, an industrial or home robot, an automatic teller machine (ATM), a point of sales (POS) device, or an Internet of things (IoT) device (e.g., light bulbs, various sensors, electric or gas meters, sprinklers, fire alarms, thermostats, street lamps, toasters, fitness equipment, a hot-water tank, a heater, a boiler, etc.).

An electronic device may also include furniture and/or a part of a building or structure, an electronic board, an electronic signature receiving device, a projector, and various meters (e.g., a water measurement device, an electrical measurement device, a gas measurement device, or a radio wave measurement device).

An electronic device may be a flexible electronic device.

An electronic device may also be a combination of the above-described various devices. However, an electronic device of the present disclosure is not limited to the above-described examples, and may include new electronic devices developed in line with technical progress.

Herein, a "user" may refer to a person who uses an electronic device or a device that uses the electronic device (e.g., an artificial intelligence electronic device).

The term "and/or" includes any and all combinations of one or more of the associated listed items. Expressions such as "at least one of," when preceding a list of elements, modify the entire list of elements and do not modify the individual elements of the list.

Figure 1B:
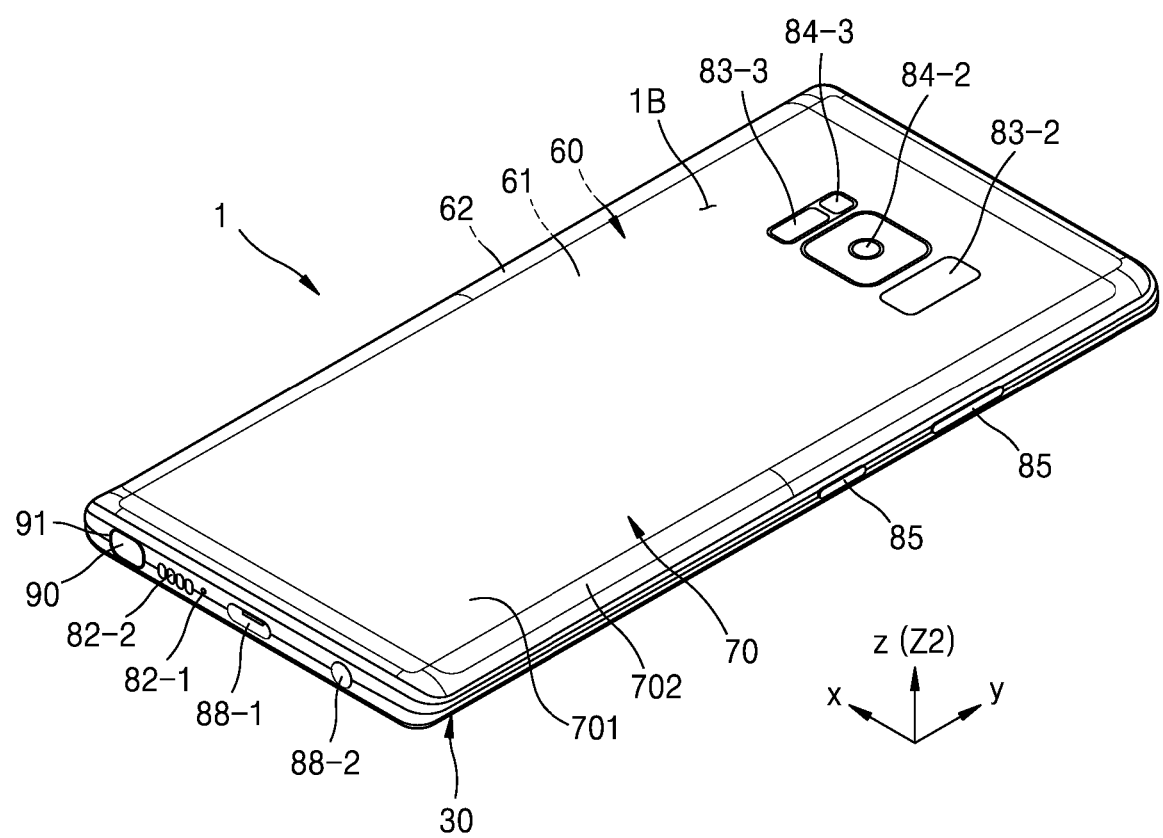

FIGS. 1A and 1B illustrate perspective views of an electronic device according to an embodiment.

Figure 2:
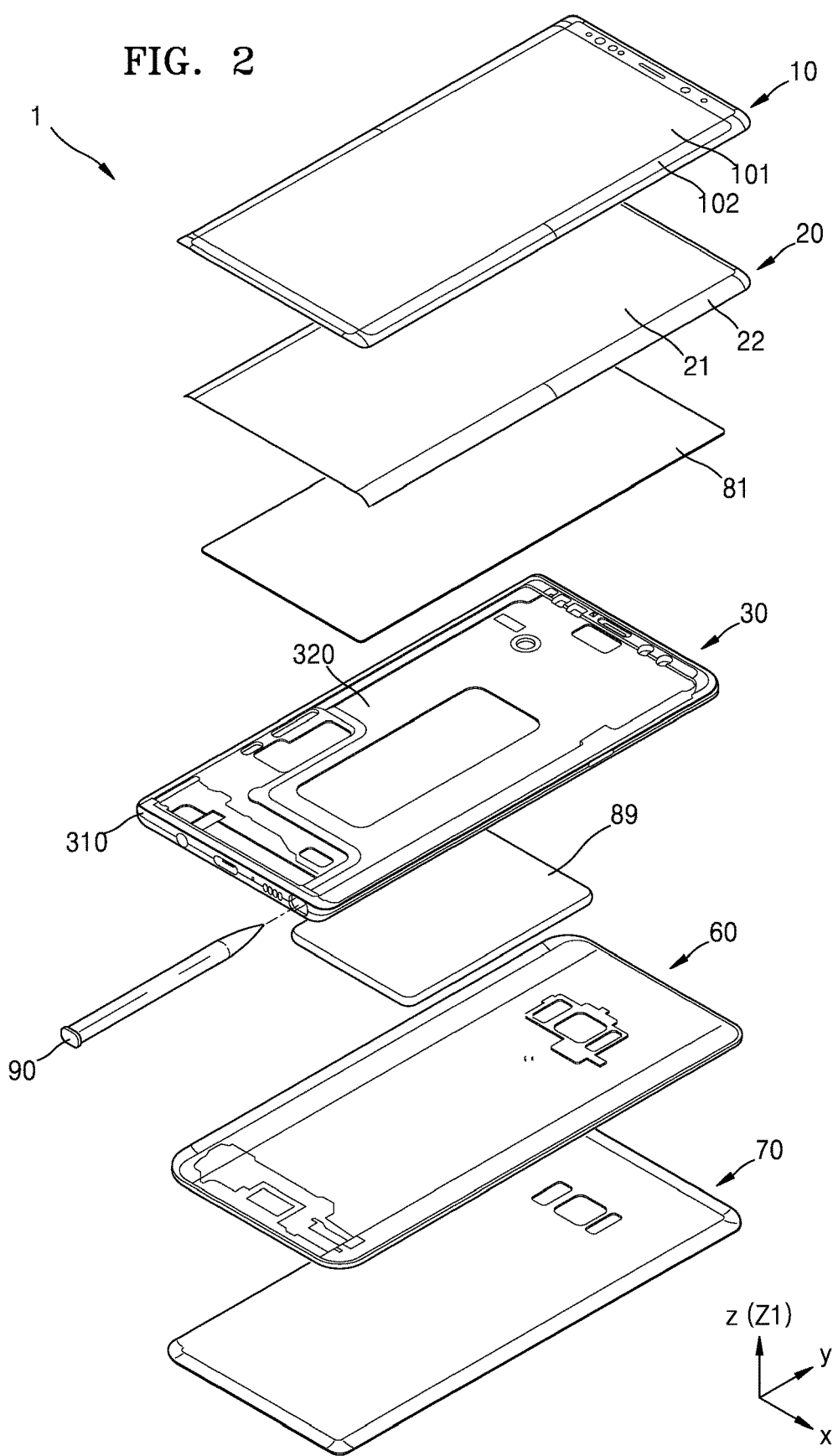
FIG. 2 illustrates a disassembled perspective view of an electronic device according to an embodiment.

FIG. 2 illustrates a disassembled perspective view of the electronic device according to an embodiment.

Referring to FIGS. 1A, 1B, and 2, an electronic device 1 includes a first transparent member 10 on a front surface 1A, a display module 20 arranged behind (i.e., in a rear direction Z2 of) the first transparent member 10, and the housing 30 surrounding a boundary of the first transparent member 10. The electronic device 1 further includes a rear case 60 in the rear direction Z2 of the housing 30 and a second transparent member 70 in the rear direction Z2 of the rear case 60. Although the housing 30 and the rear case 60 are illustrated as separate members, the disclosure is not limited thereto, and the housing 30 and the rear case 60 may also be integrated.

The front surface 1A of the electronic device 1 faces a user during normal use of the electronic device 1, and a rear surface 1B of the electronic device 1 is opposite to the front surface 1A. In addition, a front direction Z1 is faced by the user when the user uses the electronic device 1 normally, and the rear direction Z2 is an opposite direction to the front direction Z1.

The display module 20 includes a first display area 21 that is flat and a second display area 22 extended from the first display area 21 in a different direction from a plane of the first display area 21. The second display area 22 may extend from two side portions of the first display area 21.

A cross-sectional shape of the second display area 22 may be a curved shape. By including the second display area 22 having a curved shape, the display module 20 may have a constant size while ensuring a display area that is greater than or equal to a preset size.

Although the display module 20 is illustrated with a vertical length (y-direction) that is longer than a horizontal length (x-direction), the shape of the display module 20 is not limited thereto, and may be modified in various manners.

The display module 20 may include a display panel displaying an image, information, etc., and a touch screen panel sensing a touch input. The display panel may include an organic light-emitting display device (OLED) or a liquid crystal display device (LCD), but is not limited thereto.

The electronic device 1 further includes an electromagnetic induction panel 81, audio modules 82-1, 82-2, and 82-3, sensor modules 83-1, 83-2, and 83-3, camera modules 84-1, 84-2, and 84-3, a key input device 85, a light-emitting device 86, a pen input device 90, and connector holes 88-1 and 88-2. Alternatively, the electronic device 1 may omit at least one of the components (e.g., the key input device 85 or the light-emitting device 86) or may further include other components.

The electromagnetic induction panel 81 is disposed at the rear direction Z2 of the display module 20 and may support generation of an input event through electromagnetic induction via the pen input device 90.

The audio modules 82-1, 82-2, and 82-3 include a microphone hole 82-1 and speaker holes 82-2 and 82-3. The microphone hole 82-1 may include a microphone used to acquire an external sound, and/or a plurality of microphones arranged to sense a direction of sound. The speaker holes 82-2 and 82-3 include an external speaker hole 82-2 and a communication receiver hole 82-3. Alternatively, the speaker holes 82-2 and 82-3 and the microphone hole 82-1 may be implemented as a single hole, or a speaker may be included without the speaker holes 82-2 and 82-3 (e.g., a piezo-speaker).

The sensor modules 83-1, 83-2, and 83-3 may generate electrical signals or data values corresponding to an internal operating state of the electronic device 1 or an external environmental condition. The sensor modules 83-1, 83-2, and 83-3 include a first sensor module 83-1 (e.g., a proximity sensor) and/or a second sensor module (not shown) (e.g., a fingerprint sensor) that are arranged to face the front and/or a third sensor module 83-3 (e.g., a heart rate monitor (HRM) sensor) and/or a fourth sensor module 83-2 (e.g., a fingerprint sensor) that are arranged to face the rear. The fingerprint sensor may be arranged on the front surface 1A of the electronic device 1 (e.g., the display module 20) and also on the rear surface 1B.

The electronic device 1 may further include a sensor module, e.g., a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor.

The camera modules 84-1, 84-2, and 84-3 include a first camera device 84-1 arranged to face the front direction Z1, a second camera device 84-2 arranged to face the rear direction Z2, and/or a flash 84-3. The first and second camera devices 84-1 and 84-2 may include one or more lenses, an image sensor, and/or an image signal processor. The flash 84-3 may include a light-emitting diode or a xenon lamp. Two or more lenses (e.g., an infrared camera or wide angle and telephoto lenses) and image sensors may be arranged on one surface of the electronic device 1.

The key input device 85 may be arranged in the housing 30. Alternatively, the electronic device 1 may omit some or all of the key input devices 85 described above, and the omitted key input devices 85 may be implemented in other forms, e.g., as a soft key on the display module 20. The key input device 85 may include a sensor module 83-2 arranged to face the rear.

The light-emitting device 86 may be disposed to face the front. The light-emitting device 86 may provide state information of the electronic device 1 in the form of light. The light-emitting device 86 may also provide a light source that is linked with operation of, e.g., the first camera device 84-1. The light-emitting device 86 may include an LED, an IR LED, and a xenon lamp.

The connector holes 88-1 and 88-2 include a first connector hole 88-1 (e.g., a universal serial bus (USB) connector) that may receive a connector used to transmit or receive power and/or data to or from another external electronic device and a second connector hole 88-2 (e.g., an earphone jack) that may receive a connector used to transmit or receive an audio signal with another external electronic device.

The pen input device 90 (e.g., a stylus pen) may be guided into the housing 30 to be inserted into or detached from the housing 30 through a hole 91 formed in a side surface of the housing 30, and may include a button that facilitates detachment. A resonance circuit may be additionally embedded in the pen input device 90 and linked with the electromagnetic induction panel 81 (e.g., a digitizer) included in the electronic device 1. The pen input device 90 may include an electro-magnetic resonance (EMR) type, an active electrical stylus (AES) type, and an electric coupled resonance (ECR) type.

A memory may include a volatile memory or a nonvolatile memory.

An interface may include a high definition multimedia interface (HDMI), a USB interface, a Secure Digital (SD) card interface, and/or an audio interface. The interface may electrically or physically connect the electronic device 1 with another external electronic device, and may include an USB connector, an SD card/MultiMediaCard (MMC) connector or an audio connector.

A battery 89 supplies power to at least one component of the electronic device 1, and may include, e.g., a non-rechargeable primary battery, a rechargeable secondary battery or a fuel cell. At least a portion of the battery 89 may be arranged substantially on a same plane as a printed circuit board. The battery 89 may be integrally disposed inside the electronic device 1 or may be detachably disposed from the electronic device 1.

An antenna may be arranged between the rear case 60 and the battery 89. The antenna may include a near field communication (NFC) antenna, a wireless charging antenna, and/or a magnetic secure transmission (MST) antenna. An antenna may be used to conduct short range communication with an external device or to transmit or receive power for charging. An antenna structure may be formed of portions of the housing 30 and/or a supporting member 320 or a combination of the portions of the housing 30 and/or the supporting member 320.

Figure 3:
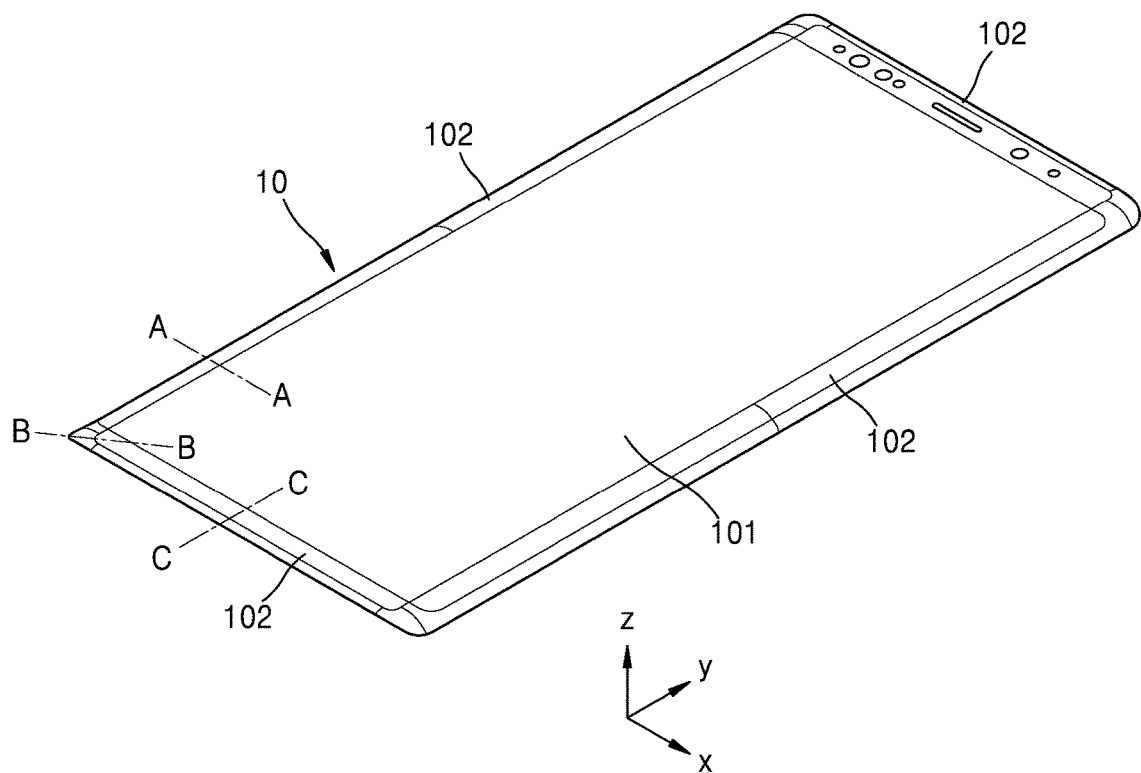
FIG. 3 illustrates a perspective view of a first transparent member according to an embodiment.

FIG. 3 is a perspective view illustrating a first transparent member according to an embodiment.

Referring to FIGS. 1A, 2, and 3, the first transparent member 10 is arranged at the front direction Z1 of the display module 20. The first transparent member 10 is arranged on the front surface 1A of the electronic device 1. The first transparent member 10 functions as a window of the display module 20, and may support the display module 20 or prevent damage to the display module 20. Further, the first transparent member 10 forms an outer appearance of the electronic device 1 together with the housing 30 and the second transparent member 70.

A size of the first transparent member 10 is larger than that of the display module 20. An opaque layer may be arranged in an outermost portion of the first transparent member 10. The opaque layer may be a black matrix.

The first transparent member 10 includes a transparent glass material such that a screen displayed on the display module 20 is exposed outwards. The first transparent member 10 may include tempered glass. However, the material of the first transparent member 10 is not limited to glass, and any other transparent material may be used. For example, the first transparent member 10 may be acryl, a sapphire material, a synthetic resin material, or a ceramic material.

The first transparent member 10 includes a first area 101 providing a planar surface and a second area 102 that is around a boundary of the first area 101 and provides a curved surface. The first area 101 may be arranged at the front direction Z1 of the first display area 21, and a portion of the second area 102 may be arranged at the front direction Z1 of the second display area 22.

Figure 4:
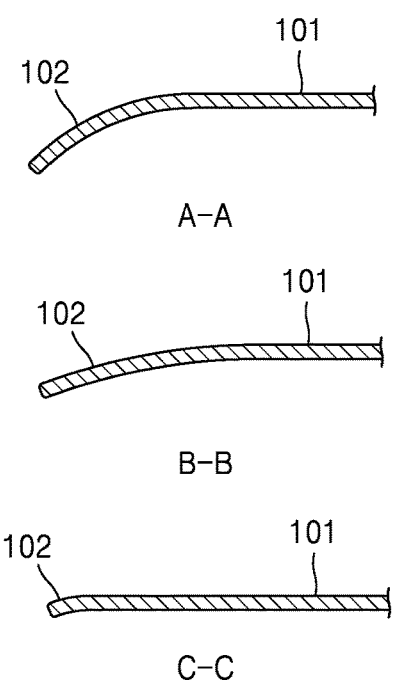
FIG. 4 illustrates a cross-sectional view of the first transparent member of FIG. 3 taken along lines A-A, B-B, and C-C, according to an embodiment.

FIG. 4 illustrates a cross-sectional view of the first transparent member of FIG. 3, taken along lines A-A, B-B, and C-C, according to an embodiment.

Referring to FIGS. 3 and 4, the second area 102 of the first transparent member 10 has curvature that varies according to positions thereof. The second area 102 located in a side portion of the first transparent member 10 has a first curvature as shown by A-A of FIG. 4, and the second area 102 located in a lower portion or an upper portion of the first transparent member 10 has a second curvature that is less than the first curvature, as shown by C-C of FIG. 4. The second area 102 located in each corner of the first transparent member 10, as shown by B-B of FIG. 4, has a third curvature that is less than the first curvature and greater than the second curvature.

However, the shape of the first transparent member 10 is not limited thereto, and may be modified in various manners. For example, the second area 102 providing a curved surface may be omitted from the first transparent member 10, and only the first area 101 providing a planar surface may be included in the first transparent member 10. As another example, the second area 102 of the first transparent member 10 may have a constant curvature despite varying positions thereof.

Figure 5:
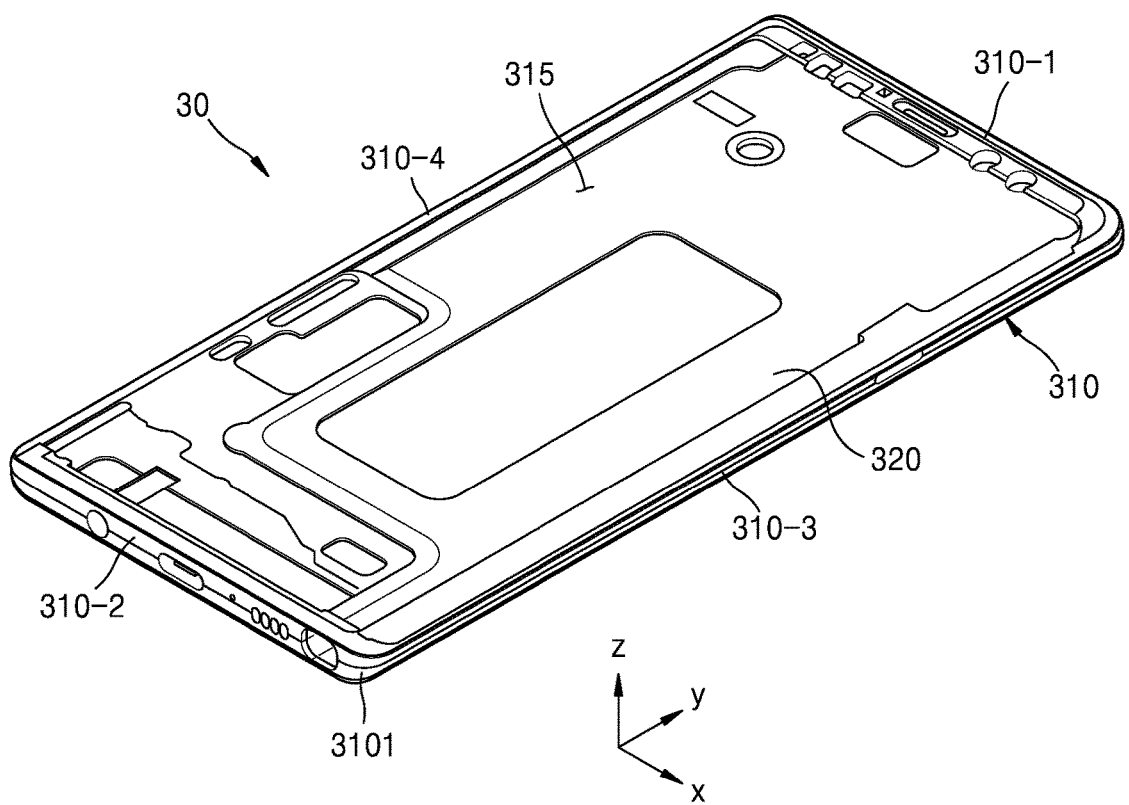
FIG. 5 illustrates a perspective view illustrating a housing according to an embodiment.

FIG. 5 illustrates a perspective view illustrating a housing according to an embodiment.

Figure 6A:
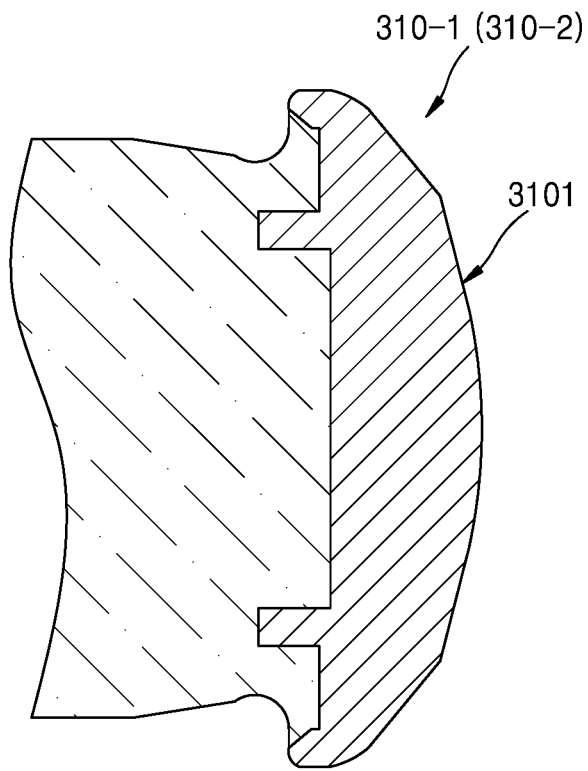
FIG. 6A illustrates a cross-sectional view of a first sidewall or a second sidewall of FIG. 5, according to an embodiment.
Figure 6B:
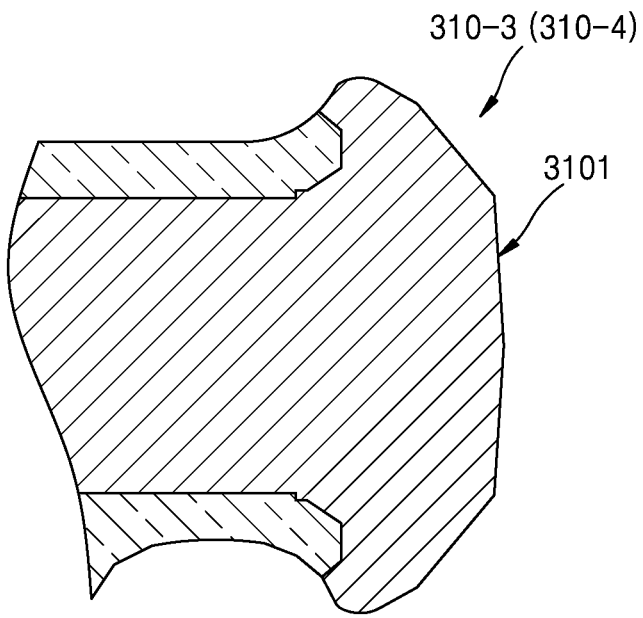
FIG. 6B illustrates a cross-sectional view of a third sidewall or a fourth sidewall of FIG. 5, according to an embodiment.

FIG. 6A illustrates a cross-sectional view of a first sidewall or a second sidewall of FIG. 5, according to an embodiment. FIG. 6B illustrates a cross-sectional view of a third sidewall or a fourth sidewall of FIG. 5, according to an embodiment.

Referring to FIGS. 2, 5, 6A, and 6B, the housing 30 surrounds a boundary of the first transparent member 10 and forms a lateral outer appearance of the electronic device 1. The housing 30 is arranged to surround a boundary of the second area 102 of the first transparent member 10. The housing 30 includes a sidewall 310 defining a first opening portion 315 in which the first transparent member 10 and the display module 20 are to be arranged.

The sidewall 310 includes a first sidewall 310-1 and a second sidewall 310-2 in upper and lower portions of the electronic device 1 and a third sidewall 310-3 and a fourth sidewall 310-4 respectively connecting two end portions of the first sidewall 310-1 and the second sidewall 310-2. The first sidewall 310-1 is arranged in a upper side of the first transparent member 10, the second sidewall 310-2 is arranged in a lower side of the first transparent member 10, the third sidewall 310-3 is arranged in a right side of the first transparent member 10, and the fourth sidewall 310-4 is arranged in a left side of the first transparent member 10.

Referring to FIGS. 6A and 6B, the first sidewall 310-1 and the second sidewall 310-2 in the upper and lower portions of the electronic device 1 may have a greater thickness than the third sidewall 310-3 and the fourth sidewall 310-4. A thickness of corners where the first and second sidewalls 310-1 and 310-2 and the third and fourth sidewalls 310-3 and 310-4 are connected may be thinner than the first and second sidewalls 310-1 and 310-2 and thicker than the third and fourth sidewalls 310-3 and 310-4.

Referring to FIGS. 2 and 5, at least a portion of an external surface 3101 of the sidewall 310 is curved considering curvature of the second area 102 of the first transparent member 10.

The housing 30 includes the supporting member 320 supporting various components of the electronic device 1. The supporting member 320 may be arranged inside the electronic device 1 to be connected to the sidewall 310 or may be integrally formed with the sidewall 310.

The display module 20 may be coupled to a first surface of the supporting member 320, and a printed circuit board may be coupled to a second surface of the supporting member 320. A processor, a memory, and/or an interface may be mounted on the printed circuit board. The processor may include at least one of, for example, a central processing unit (CPU), an application processor (AP), a graphic processing unit (GPU), an image signal processor (ISP), a sensor hub processor, and a communication processor (CP).

The housing 30 may include a metallic material. For example, the sidewall 310 may include a metallic material, e.g., at least one of stainless steel, an aluminum alloy, and a magnesium alloy. As the housing 30 includes a metallic material, the strength of the electronic device 1 may be ensured to some extent while enhancing the aesthetic sense of the electronic device 1.

The supporting member 320 of the housing 30 may also include a metallic material. However, the material of the supporting member 320 is not limited thereto. For example, unlike the material of the sidewall 310, the material of the supporting member 320 may include a non-metallic material.

Referring again to FIGS. 1B and 2, the rear case 60 is arranged at the rear direction of the housing 30, and may protect various inside components together with the housing 30.

The rear case 60 may include a metallic material, e.g., at least one of stainless steel, an aluminum alloy, and a magnesium alloy. However, the material of the rear case 60 is not limited to the metallic material, and any of various opaque materials may be used as the material of the rear case 60. For example, the rear case 60 may include a non-metallic material such as a synthetic resin.

The rear case 60 includes a first cover area 61 that is flat and a second cover area 62 extending from the first cover area 61 in a different direction from a planar surface of the first cover area 61. A cross-sectional shape of the second cover area 62 may be a curved shape.

The second transparent member 70 is arranged at the rear direction Z2 of the rear case 60. The second transparent member 70 is arranged on the rear surface 1B of the electronic device 1. Together with the rear case 60, the second transparent member 70 protects various components inside the electronic device 1 and provides an aesthetic sense to the rear surface 1B of the electronic device 1. Further, the second transparent member 70 provides space for components arranged on the rear surface 1B of the electronic device 1, e.g., the camera modules 84-2 and 84-3 and the sensor modules 83-2 and 83-3.

The second transparent member 70 includes a transparent glass material, e.g., tempered glass. However, the material of the second transparent member 70 is not limited to glass, and any other transparent material may also be used as the material of the second transparent member 70. For example, the second transparent member 70 may be acryl, a sapphire material, or a synthetic resin material.

The second transparent member 70 includes a first area 701 arranged at the rear direction Z2 of the first cover area 61 and a second area 702 arranged at the rear direction Z2 of the second cover area 62. The first area 701 provides a planar surface, and the second area 702 is arranged around a boundary of the first area 701 and provides a curved surface.

The second area 702 of the second transparent member 70 may have curvature that varies according to positions thereof. For example, the second area 702 in upper and lower portions of the second transparent member 70 has a first curvature, and the second area 702 arranged in two side portions of the second transparent member 70 has a second curvature that is greater than the first curvature. The second area 702 arranged in each corner of the second transparent member 70 has a third curvature that is greater than the first curvature and smaller than the second curvature.

The first transparent member 10 and the second transparent member 70, which are relatively vulnerable to damage, are likely to be cracked or damaged if the electronic device 1 having the above-described structure is dropped. The electronic device 1 according to an embodiment has a structure in which damage to the first transparent member 10 or the second transparent member 70 may be prevented.

Figure 7:
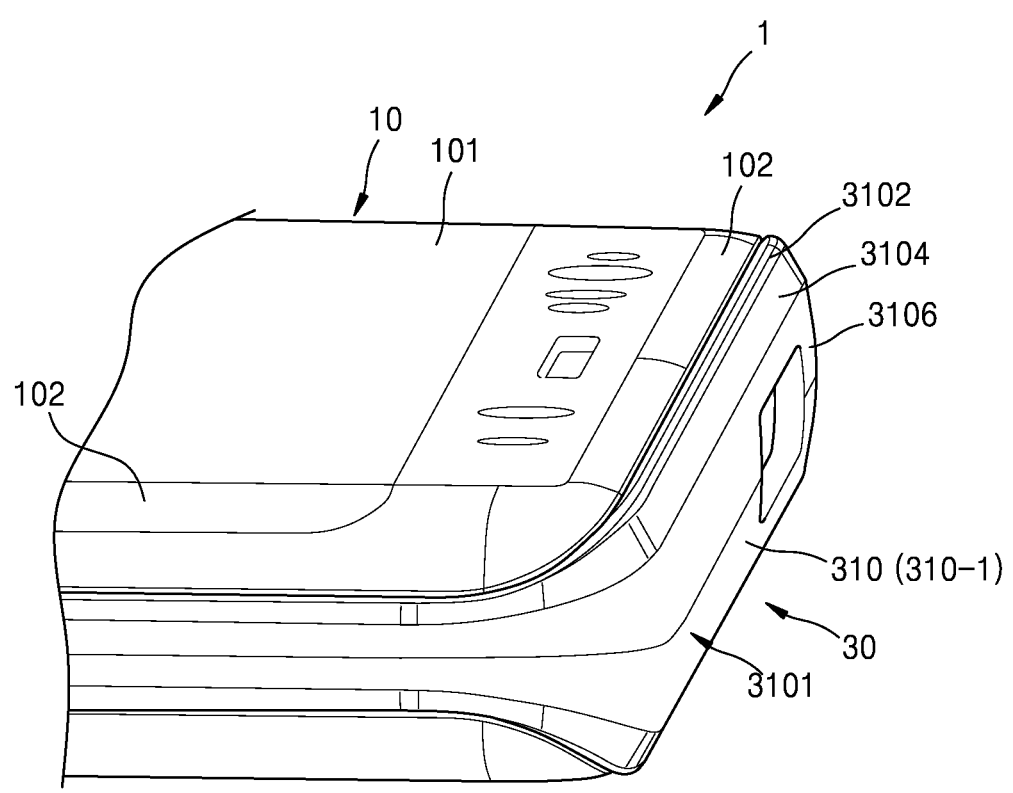
FIG. 7 illustrates an expanded perspective view of an upper portion of the electronic device illustrated in FIG. 1A, according to an embodiment.

FIG. 7 illustrates an expanded perspective view of an upper portion of the electronic device illustrated in FIG. 1A, according to an embodiment.

Figure 8:
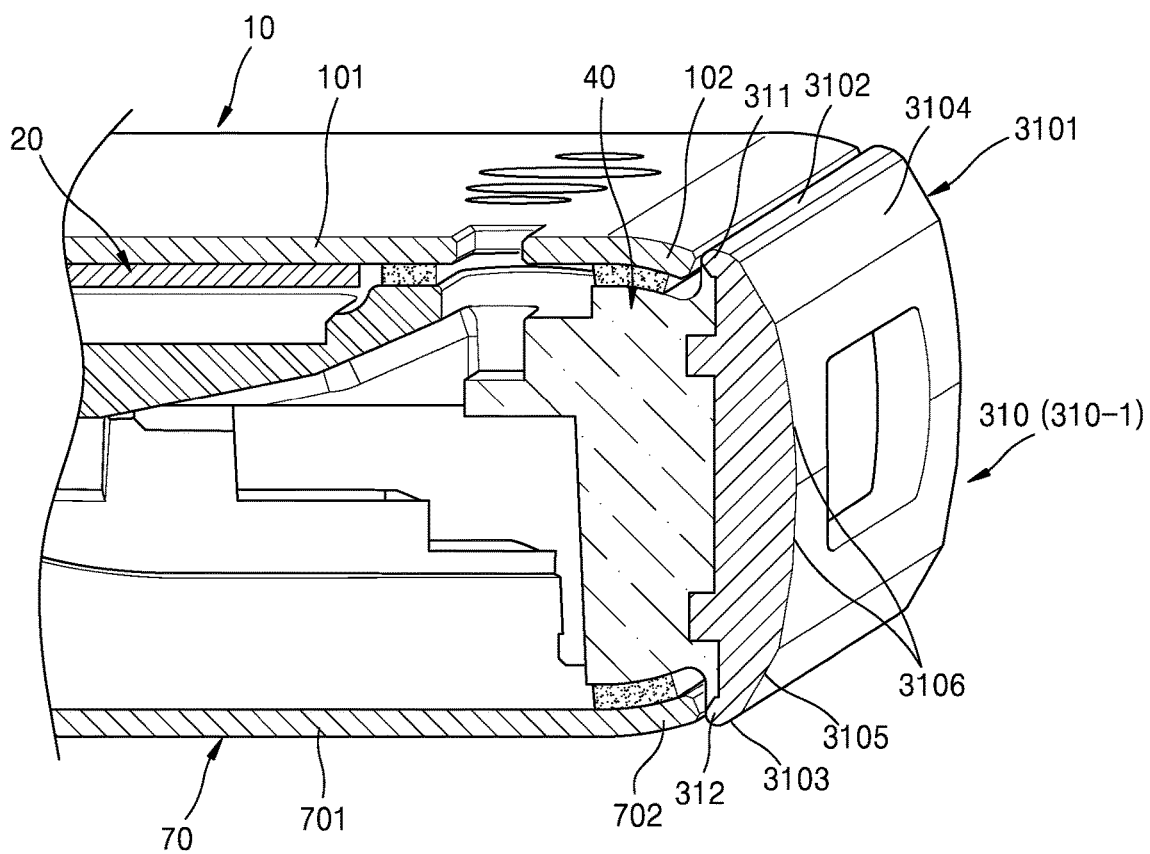
FIG. 8 illustrates a cross-sectional view of the electronic device of FIG. 7, according to an embodiment.

FIG. 8 illustrates a cross-sectional view of the electronic device of FIG. 7, according to an embodiment.

Referring to FIGS. 7 and 8, the sidewall 310 of the housing 30 includes a first protection portion 311 arranged adjacent to the boundary of the first transparent member 10. The sidewall 310 of the housing 30 includes a second protection portion 312 that is arranged adjacent to a boundary of the second transparent member 70.

The first and second protection portions 311 and 312 prevent direct collision between the first and second transparent members 10 and 70 and an external object or a bottom surface, thereby protecting the first and second transparent members 10 and 70.

The first protection portion 311 and the second protection portion 312 may be integrally formed with the sidewall 310. The first protection portion 311 and the second protection portion 312 may be a portion of the sidewall 310. The first and second protection portions 311 and 312 may include a metallic material, e.g., at least one of stainless steel, an aluminum alloy, and a magnesium alloy.

When the first and second protection portions 311 and 312 are formed of a non-metallic material having a smaller strength than a metallic material, surfaces of the first and second protection portions 311 and 312 are likely to be damaged due to collision or abrasion occurring during a manufacturing operation of the electronic device 1 or during use of the electronic device 1.

However, according to an embodiment, as the first and second protection portions 311 and 312 include a metallic material, damage to the surfaces thereof due to collision or abrasion may be reduced.

Figure 9A:
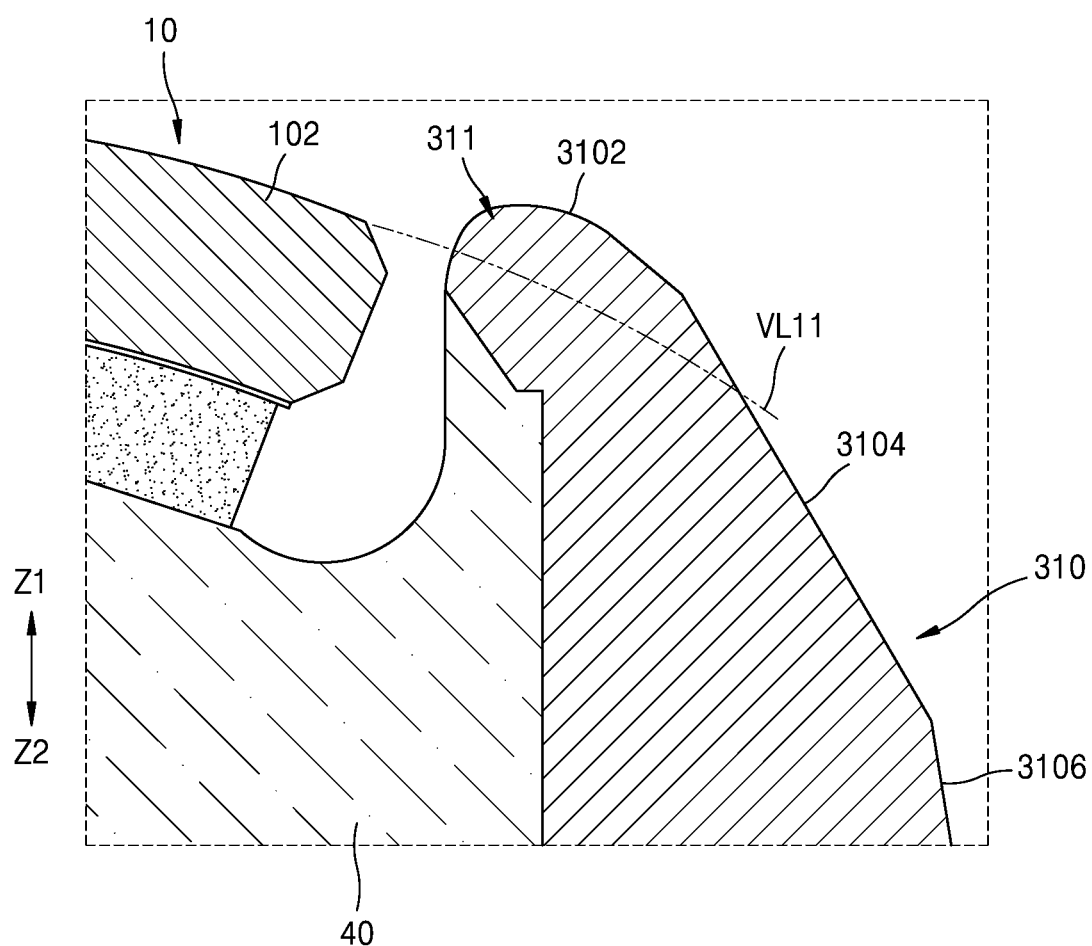
FIG. 9A illustrates a first protection portion of a sidewall adjacent to the first transparent member, according to an embodiment.

FIG. 9A illustrates a first protection portion of a sidewall adjacent to the first transparent member, according to an embodiment.

Referring to FIG. 9A, a portion of an external surface 3102 of the first protection portion 311 is arranged to protrude from a first virtual extension line VL11 extending virtually along an external surface of the first transparent member 10.

Figure 9B:
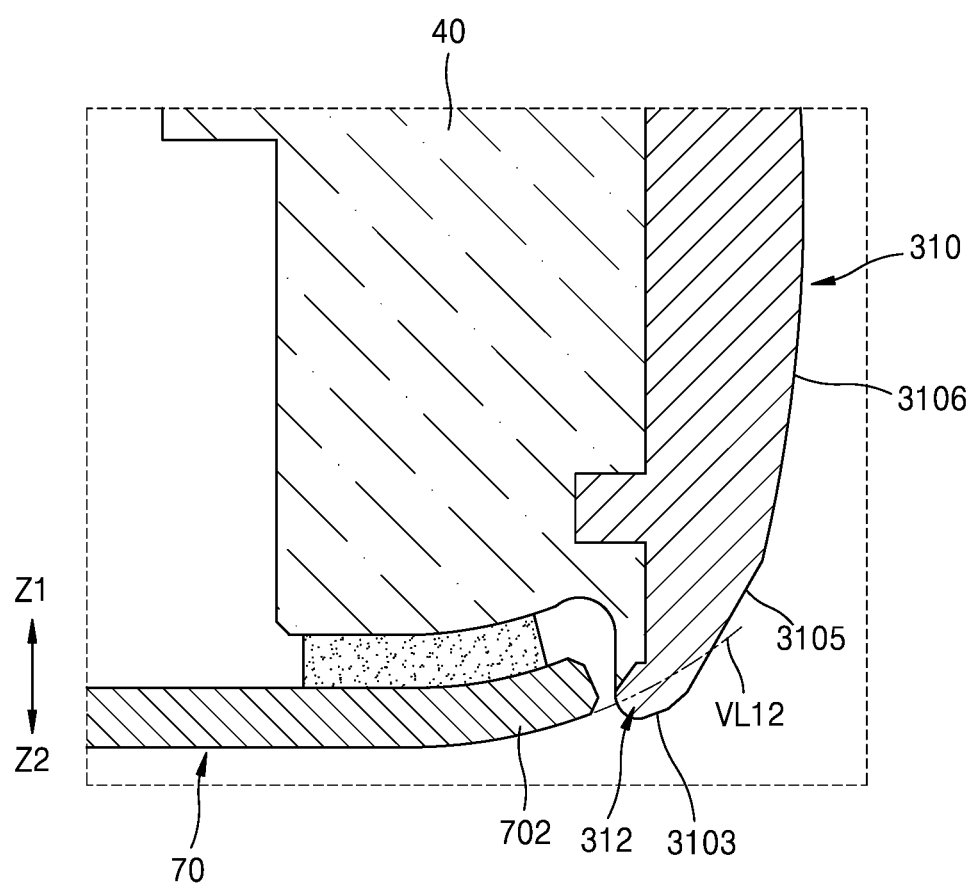
FIG. 9B illustrates a second protection portion of a sidewall adjacent to a second transparent member, according to an embodiment.

FIG. 9B illustrates a second protection portion of a sidewall adjacent to a second transparent member, according to an embodiment.

Referring to FIG. 9B, a portion of an external surface 3103 of the second protection portion 312 is arranged to protrude from a first virtual extension line VL12 extending virtually along an external surface of the second transparent member 70. As the external surfaces 3102 and 3103 of the first and second protection portions 311 and 312 respectively protrude further than the external surfaces of the first and second transparent members 10 and 70, direct impact on the first and second transparent members 10 and 70 may be minimized. Accordingly, the first and second protection portions 311 and 312 may perform a function of protecting the first and second transparent members 10 and 70.

However, the external surfaces 3102 and 3103 of the first and second protection portions 311 and 312 do not necessarily protrude further than the external surfaces of the first and second transparent members 10 and 70, and may be arranged at same positions as the external surfaces 3102 and 3103 of the first and second transparent members 10 and 70. Also, in this structure, direct impact on the first and second transparent members 10 and 70 may be prevented to some extent.

Figure 10A:
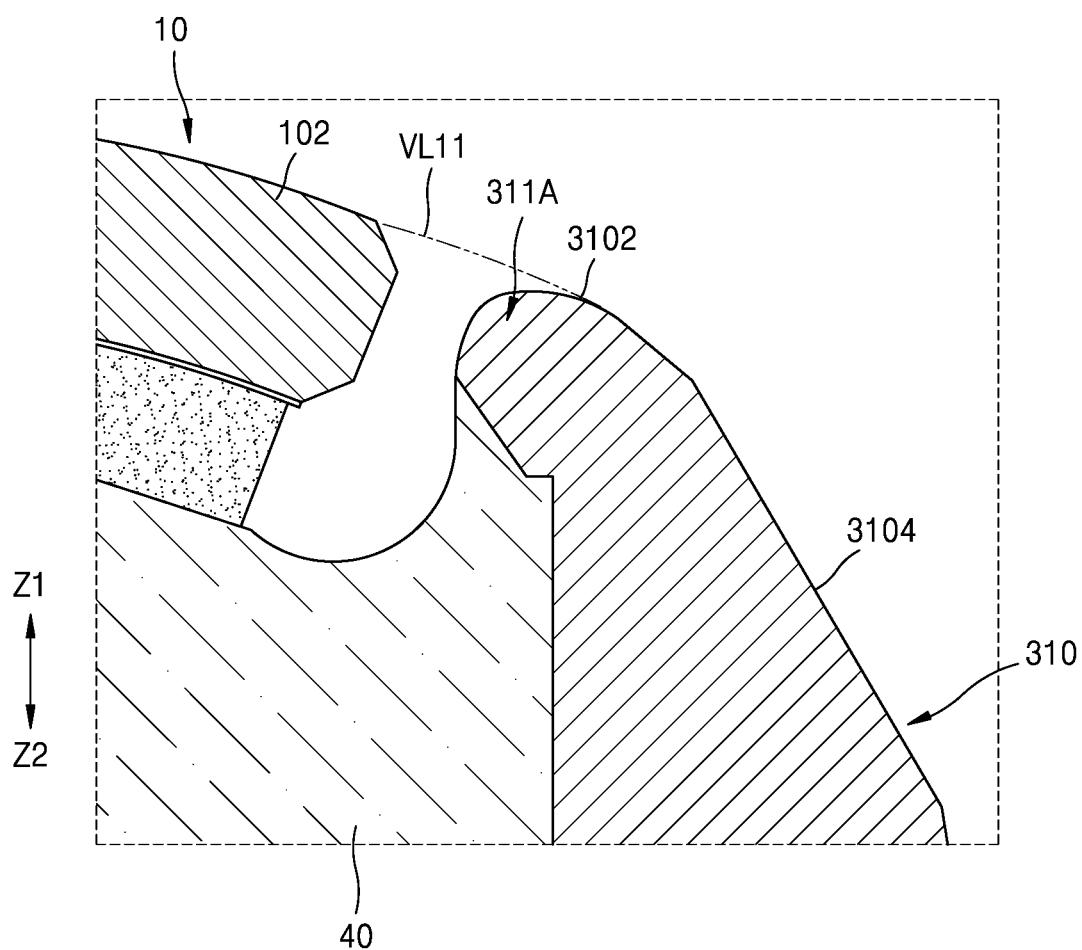
FIGS. 10A and 10B illustrate first and second protection portions of a sidewall according to an embodiment.
Figure 10B:
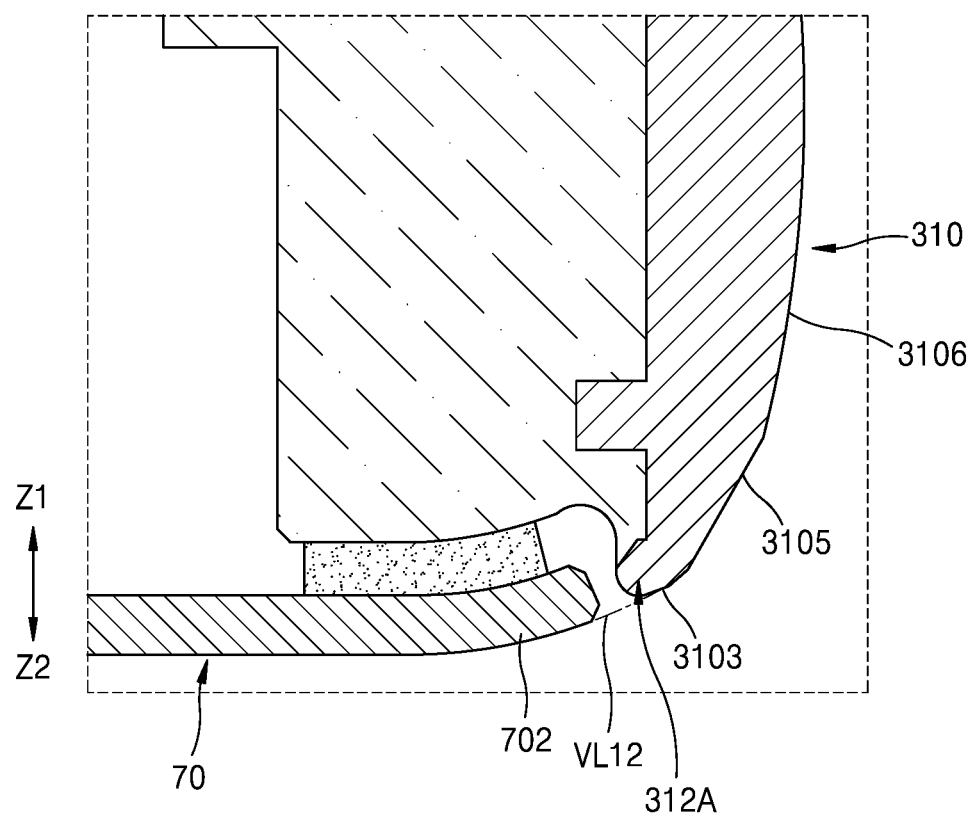

FIGS. 10A and 10B illustrate first and second protection portions of a sidewall according to an embodiment.

Referring to FIG. 10A, a portion of an external surface 3102 of a first protection portion 311A is arranged at a same position as a first virtual extension line VL11 without a portion of the external surface 3102 protruding further than the first virtual extension line VL11.

Referring to FIG. 10B, a portion of an external surface 3103 of a second protection portion 312A is arranged at a same position as a first virtual extension line VL12 without a portion of the external surface 3103 protruding further than the first virtual extension line VL12. As the portions of the external surfaces 3102 and 3103 of the first and second protection portions 311A and 312A are arranged at same positions as the first virtual extension lines VL11 and VL12, the first and second protection portions 311A and 312A may perform a function of protecting the first and second transparent members 10 and 70.

The sidewall 310 of the housing 30 includes the first and second protection portions 311 and 312 as described above, thereby preventing direction collision of the first and second transparent members 10 and 70 against a bottom surface when the electronic device 1 is dropped.

However, even when the sidewall 310 of the housing 30 includes the first and second protection portions 311 and 312, when the electronic device 1 is dropped, impact or an external force is applied to the sidewall 310 of the housing 30. When an impact applied to the sidewall 310 is transferred to a relatively vulnerable component, e.g., to the first transparent member 10 or the second transparent member 70, the first transparent member 10 or the second transparent member 70 may be cracked or damaged. Due to the impact on the sidewall 310, the sidewall 310 may be deformed temporarily or permanently. When the first and second transparent members 10 and 70 have a smaller strength than the sidewall 310 of the housing 30, the first and second transparent members 10 and 70 may be cracked or damaged due to collision with the sidewall 310 that has deformed.

A member for absorbing impact may be arranged between the first and second transparent members 10 and 70 and the sidewall 310 to prevent cracks on or damage to the first and second transparent members 10 and 70. Accordingly, the electronic device 1 further includes an absorption member 40 arranged inside the housing 30. The absorption member 40 contacts an inner surface of the sidewall 310, and at least a portion of the absorption member 40 may be arranged to face a side surface 10S or 70S of at least one of the first transparent member 10 and the second transparent member 70. The portion of the absorption member 40 arranged to face the side surface 10S or 70S of at least one of the first transparent member 10 and the second transparent member 70 may extend in a direction parallel to a boundary direction of the first transparent member 10 or the second transparent member 70 (x-direction or y-direction). A structure including the housing 30 and the absorption member 40 may be defined as a housing structure.

Figure 11:
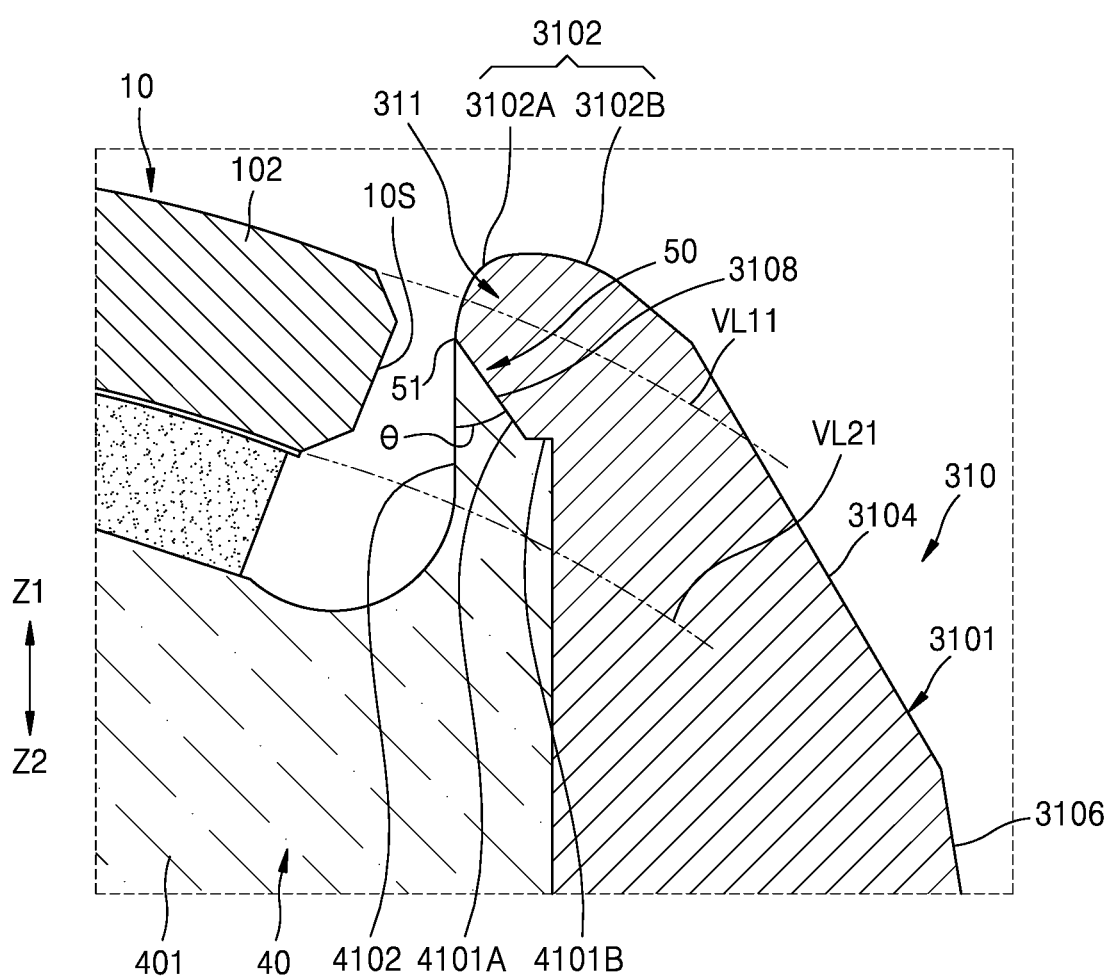
FIG. 11 illustrates a housing structure of an electronic device according to an embodiment.

FIG. 11 illustrates is a view for describing a housing structure of an electronic device according to an embodiment.

Referring to FIG. 11, the absorption member 40 includes a material having a less strength than the sidewall 310 in order to absorb impact or an external force applied to the sidewall 310. For example, the absorption member 40 may include a non-metallic material, such as a plastic, a resin, a rubber, or a mixture thereof.

The absorption member 40 is arranged between the first transparent member 10 and the sidewall 310. At least a portion of the absorption member 40 may be arranged to face the side surface 10S of the first transparent member 10.

The interface 50 between the absorption member 40 and the first protection portion 311 may be disposed inward relative to the first virtual extension line VL11. For example, a portion 51 of the interface 50 between the absorption member 40 and the first protection portion 311, which faces the first transparent member 10, may be disposed inward relative to the first virtual extension line VL11. Accordingly, exposure of the interface 50 between the absorption member 40 and the first protection portion 311 to the outside may be prevented.

When the interface 50 between the absorption member 40 and the first protection portion 311 is exposed to the outside, various problems may arise.

For example, since the absorption member 40 and the first protection portion 311 are formed of different materials, there may be a color transition in the interface 50 between the absorption member 40 and the first protection portion 311. As described above, when the color transition in the interface 50 between the absorption member 40 and the first protection portion 311 is apparent outside the electronic device 1, an overall aesthetic sense of the electronic device 1 may be degraded.

In addition, burring may occur near the interface 50 between the first protection portion 311 and the absorption member 40, which are formed of different materials in a surface processing process. When burring occurs outside the electronic device 1, aesthetic sense of the electronic device 1 may be degraded, and thus, an additional operation to remove burrs is required.

When the interface 50 between the absorption member 40 and the first protection portion 311 is exposed to the outside, color blurring may occur on an external surface of the housing 30. An anodizing process may be used to form a color of the housing 30, and color blurring may occur in an area of the first protection portion 311 adjacent to the interface 50 between the absorption member 40 and the first protection portion 311.

However, according to an embodiment, a portion 51 of the interface 50 between the absorption member 40 and the first protection portion 311, which faces the first transparent member 10, may be disposed inward relative to the first virtual extension line VL11 of the first transparent member 10, thereby preventing the above-described problems when the interface 50 between the absorption member 40 and the first protection portion 311 is exposed to the outside.

The portion 51 of the interface 50 between the absorption member 40 and the first protection portion 311, which faces the first transparent member 10, may be arranged to protrude outwardly from a second virtual extension line VL21 virtually extending along an inner surface of the first transparent member 10.

The external surface 3101 of the sidewall 310 of the housing 30 includes a main side surface 3106, an external surface 3102 of the first protection portion 311, and an auxiliary side surface 3104 arranged between the main side surface 3106 and the external surface 3102 of the first protection portion 311 and at a different angle from the main side surface 3106.

The external surface 3102 of the first protection portion 311 may have a preset curvature. As the first protection portion 311 has a preset curvature, concentration of an external force on a certain area of the first protection portion 311 may be reduced. The external surface 3102 of the first protection portion 311 include a surface 3102A having a first curvature and a surface 3102B having a second curvature that is different from the first curvature.

The main side surface 3106 may have a larger area than the auxiliary side surface 3104. An angle of the auxiliary side surface 3104 with respect to the rear direction Z2 of the electronic device 1 may be greater than 30° and less than 60°.

The auxiliary side surface 3104 may be formed by using a diamond cutting method. The auxiliary side surface 3104 may have a different gloss from that of the main side surface 3106.

An inner surface of the first protection portion 311 includes an inclined surface 3108, which is inclined at a preset angle with respect to the rear direction Z2 of the electronic device 1. A portion of the inner surface of the first protection portion 311 facing the absorption member 40 may include the inclined surface 3108, which is inclined at a preset angle with respect to the rear direction Z2 of the electronic device 1. The inclined surface 3108 may be inclined at a preset angle with respect to the rear direction Z2 of the electronic device 1. An angle of the inclined surface 3108 of the first protection portion 311 with respect to the rear direction Z2 of the electronic device 1 may be greater than 30° and less than 60°.

A surface of the absorption member 40 facing the first protection portion 311 may include an inclined surface, which is inclined at a preset angle with respect to the rear direction Z2 of the electronic device 1. An angle of the inclined surface of the absorption member 40 with respect to the rear direction Z2 of the electronic device 1 may be greater than 30° and less than 60°.

The interface 50 between the absorption member 40 and the first protection portion 311 may be inclined at a preset angle with respect to the rear direction Z2 of the electronic device 1. An angle θ of the interface 50 between the absorption member 40 and the first protection portion 311 with respect to the rear direction Z2 of the electronic device 1 may be greater than 30° and less than 60°.

Figure 12:
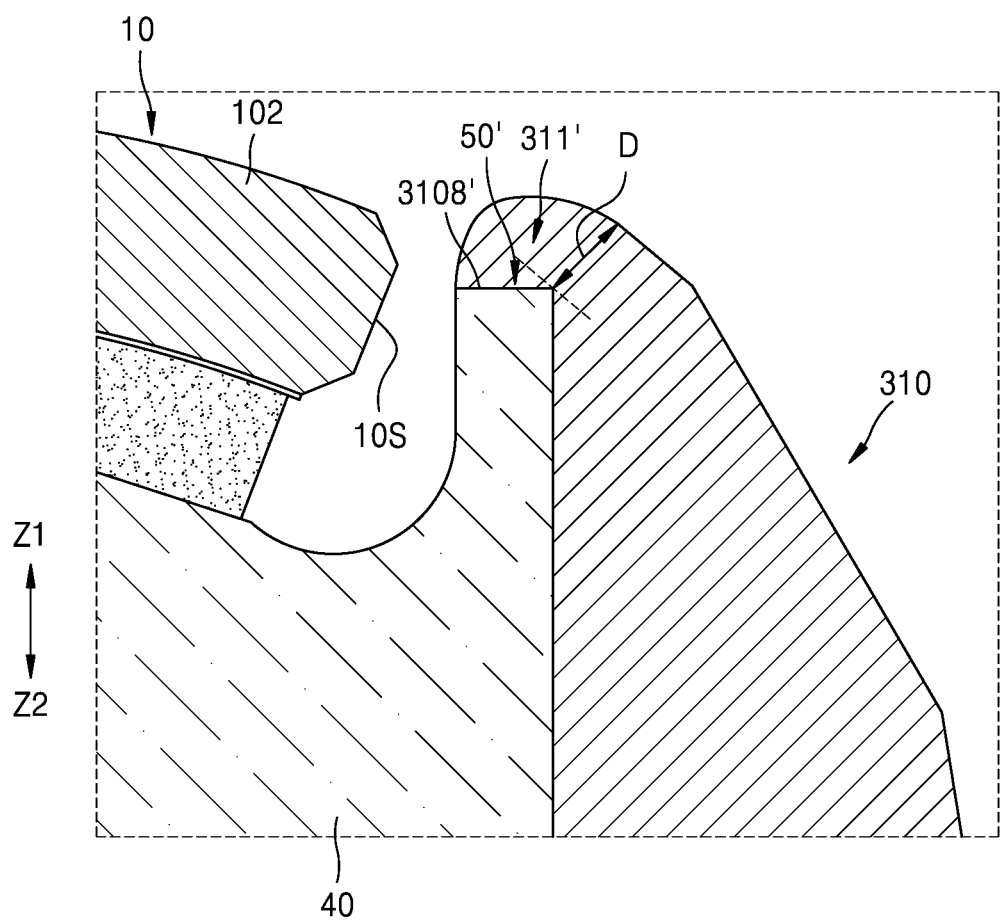
FIG. 12 illustrates a housing structure in which an interface between a first protection portion and an absorption member is not inclined, according to an embodiment.

FIG. 12 illustrates a housing structure in which an interface between a first protection portion and an absorption member is not inclined, according to an embodiment. If an inner surface 3108' of a first protection portion 311' has a surface perpendicular to the rear direction Z2 of the electronic device 1, and an interface 50' between the absorption member 40 and the first protection portion 311' is perpendicular to the rear direction Z2 of the electronic device 1 as illustrated in FIG. 12, the first protection portion 311' may have a locally small thickness D. Accordingly, when impact is applied to the first protection portion 311', force is concentrated on the locally thin portion of the first protection portion 311', thereby bending or damaging the first protection portion 311'.

However, as illustrated in FIG. 11, when an inner surface of the first protection portion 311 has the inclined surface 3108 that is inclined with respect to the rear direction Z2 of the electronic device 1, and the interface 50 between the absorption member 40 and the first protection portion 311 is inclined at a preset angle with respect to the rear direction Z2 of the electronic device 1, the first protection portion 311 may have a thickness that prevents bending or damage.

The absorption member 40 may be arranged inside the housing 30 by using an insert injection method. Accordingly, a surface of the absorption member 40 facing the sidewall 310 of the housing 30 and a surface of the sidewall 310 of the housing 30 facing the absorption member 40 may have corresponding shapes. For example, a surface of the absorption member 40 facing the sidewall 310 of the housing 30 and a surface of the sidewall 310 of the housing 30 facing the absorption member 40 may have identical shapes.

The inclined surface 3108 of the inner surface of the first protection portion 311 may have a shape corresponding to a shape of the external surface 3101 of the sidewall 310. The shape of the interface 50 between the absorption member 40 and the first protection portion 311 may have a shape corresponding to the shape of the external surface 3101 of the sidewall 310.

An angle of the inclined surface 3108 of the inner surface of the first protection portion 311 with respect to the rear direction Z2 of the electronic device 1 may correspond to an angle of the auxiliary side surface 3104 with respect to the rear direction Z2 of the electronic device 1. An angle of the interface 50 between the absorption member 40 and the first protection portion 311 with respect to the rear direction Z2 of the electronic device 1 may correspond to an angle of the auxiliary side surface 3104 with respect to the rear direction Z2 of the electronic device 1. For example, a difference between the angle of the interface 50 between the absorption member 40 and the first protection portion 311 with respect to the rear direction Z2 of the electronic device 1 and the angle of the auxiliary side surface 3104 with respect to the rear direction Z2 of the electronic device 1 may be less than or equal to 30°.

A surface 4102 of the absorption member 40 facing the side surface 10S of the first transparent member 10 may be parallel to the front and rear directions Z1 and Z2 of the electronic device 1.

Figure 13:
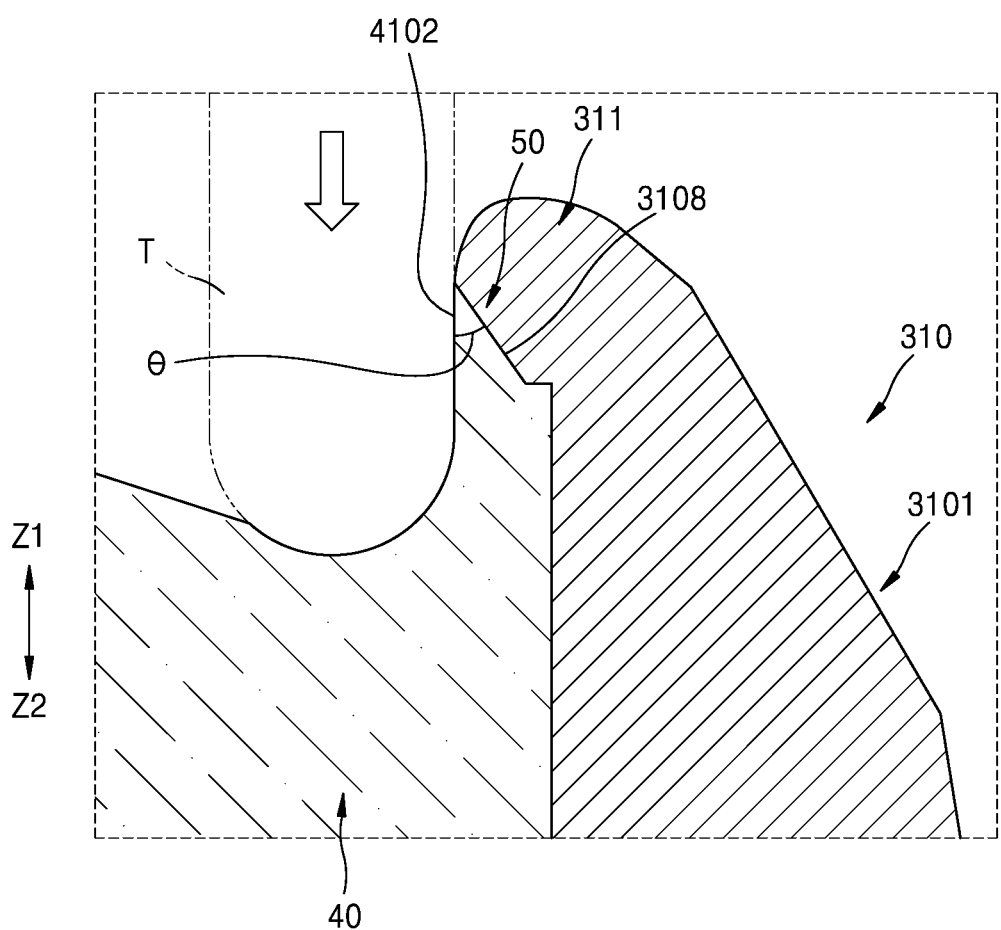
FIG. 13 illustrates a housing structure of an electronic device according to an embodiment.

FIG. 13 illustrates a housing structure of an electronic device according to an embodiment.

A surface shape of the absorption member 40 as described above may be formed by insert-injecting the absorption member 40 inside the housing 30 and then cutting the absorption member 40 by using a tool T as illustrated in FIG. 13. By forming the surface 4102 of the absorption member 40 facing the side surface 10S of the first transparent member 10 and being parallel to the directions of the front and rear directions Z1 and Z2 of the electronic device 1, dimensions, such as an interval between the first transparent member 10 and the absorption member 40, may be easily controlled, and it is easier to assemble the first transparent member 10 and the housing 30.

A surface of the absorption member 40 facing the first protection portion 311 includes an inclined surface 4101A having a preset inclination angle with respect to the rear direction Z2 of the electronic device 1 and an extended surface 4101B having a greater inclination angle than the inclined surface 4101A. An angle of the inclined surface 4101A of the absorption member 40 with respect to the rear direction Z2 of the electronic device 1 may be greater than 30° and less than 60°, and an angle of the extended surface 4101B may be 60° or greater. For example, the extended surface 4101B may be at 90° with respect to the rear direction Z2 of the electronic device 1.

When the absorption member 40 is relatively thin, an adhesive force with respect to the first protection portion 311 may decrease. However, according to an embodiment, as a surface of the absorption member 40 facing the first protection portion 311 includes the inclined surface 4101A and the extended surface 4101B, a thickness of the absorption member 40 may be increased compared to a structure in which a surface of the absorption member 40 facing the first protection portion 311 includes only the inclined surface 4101A, and accordingly, an adhesive force with respect to the first protection portion 311 may be increased.

Figure 14:
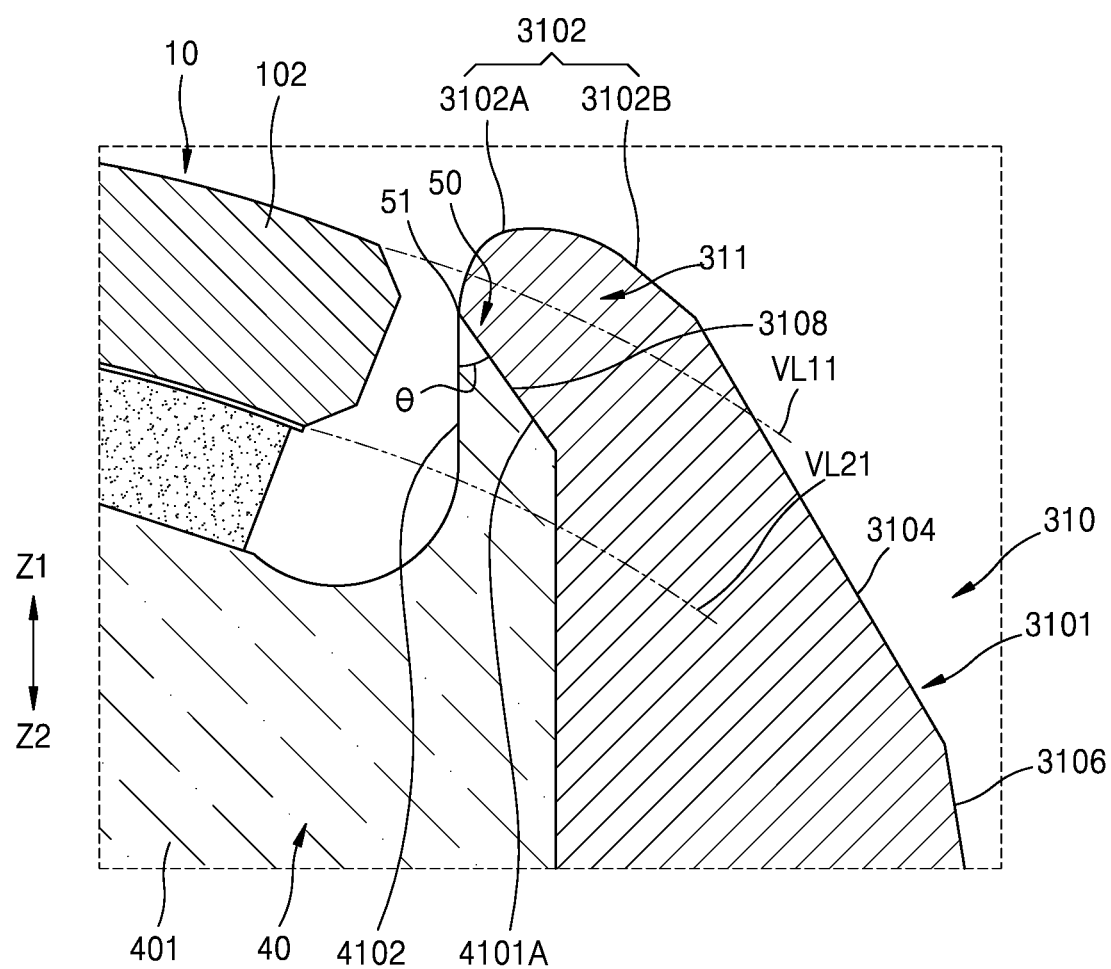
FIG. 14 illustrates a housing structure of an electronic device according to an embodiment.

FIG. 14 illustrates a housing structure of an electronic device according to an embodiment Referring to FIG. 14, the surface of the absorption member 40 facing the first protection portion 311 does not necessarily include the extended surface 4101B, and the extended surface 4101B may be omitted as necessary.

Although the description above is focused on the first sidewall 310-1, the above-described structure may also apply to other sidewalls, i.e., the second, third, and fourth sidewalls 310-2, 310-3, and 310-4, in a same or similar manner.

Although not illustrated in the drawings, the housing structure may also apply to the second sidewall 310-2 having a symmetrical structure to the first sidewall 310-1, or may also apply to the third sidewall 310-3 and the fourth sidewall 310-4 in a similar manner.

Figure 15:
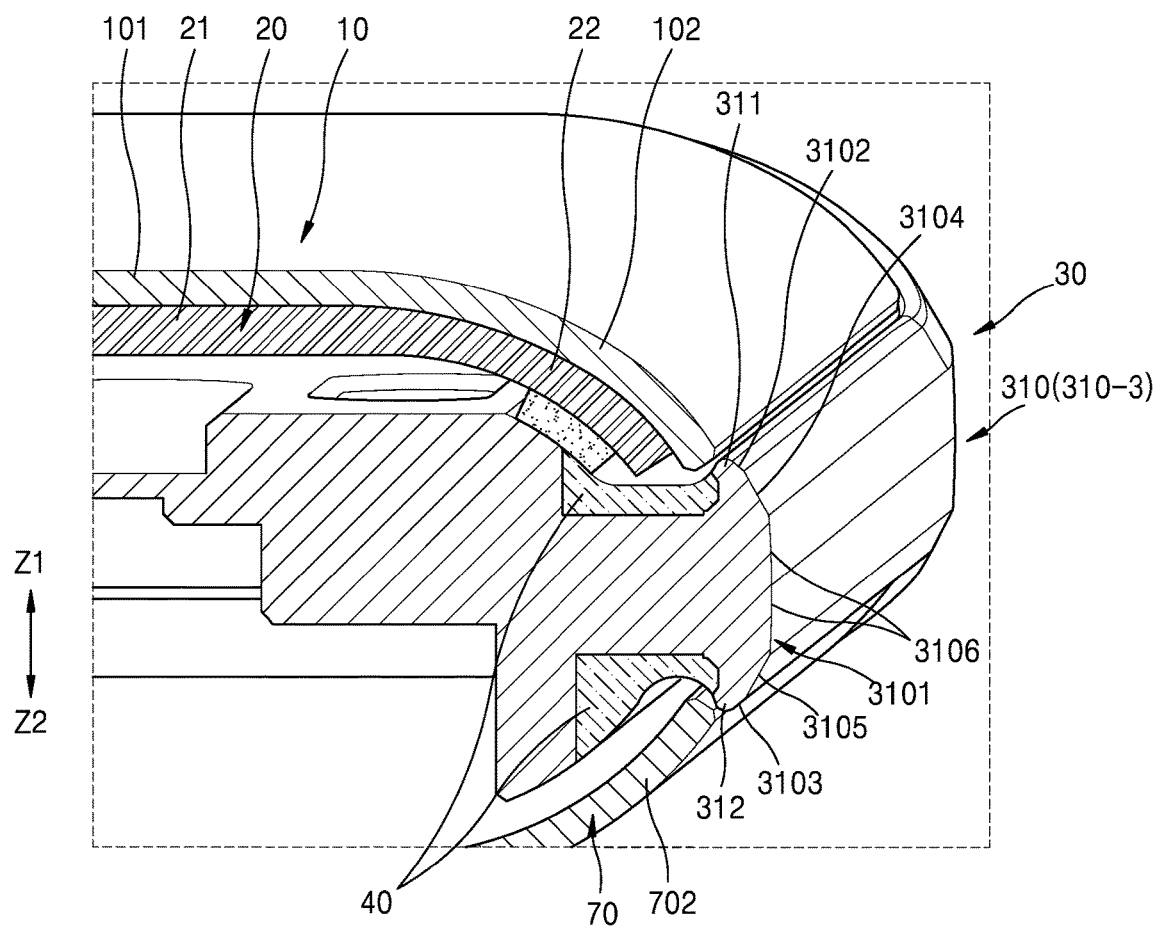
FIG. 15 illustrates a partial cross-sectional view focused on a third sidewall of an electronic device according to an embodiment.

FIG. 15 illustrates a partial cross-sectional view focused on a third sidewall of an electronic device according to an embodiment.

Figure 16:
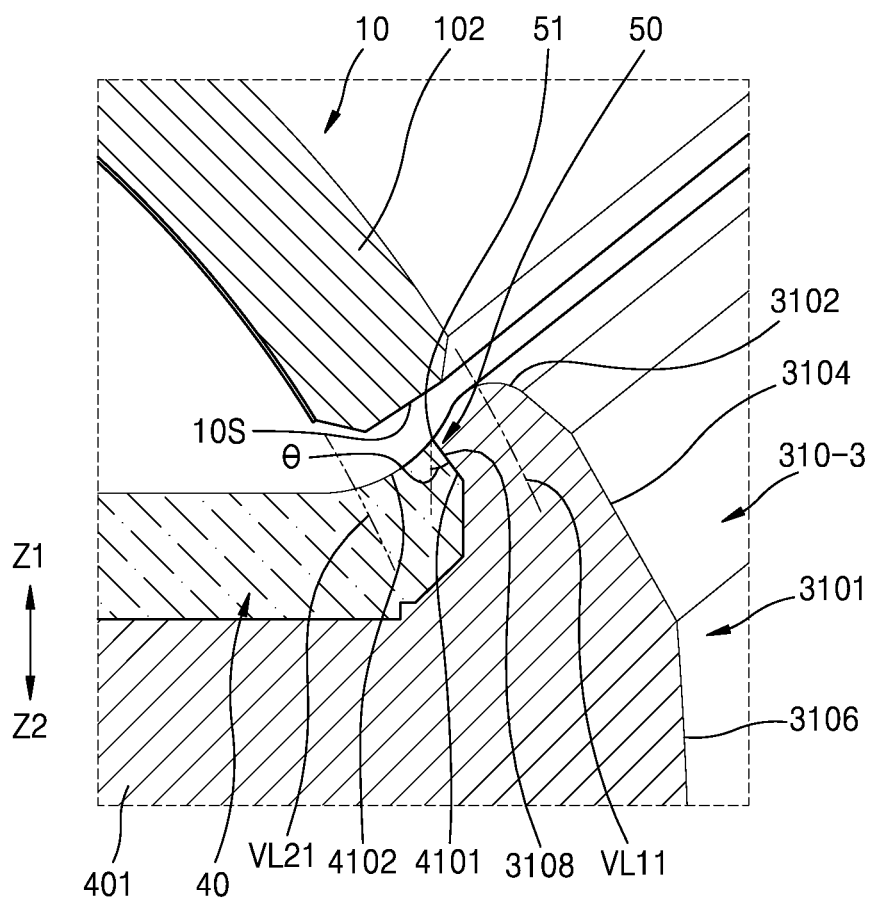
FIG. 16 illustrates an expanded view of the third sidewall adjacent to a first transparent member in FIG. 15 according to an embodiment.

FIG. 16 illustrates an expanded view of the third sidewall adjacent to a first transparent member in FIG. 15 according to an embodiment.

Referring to FIGS. 15 and 16, the third sidewall 310-3 includes a first protection portion 311 arranged adjacent to a boundary of the first transparent member 10 and a second protection portion 312 adjacent to a boundary of the second transparent member 70.

A portion of the external surface 3102 of the first protection portion 311 may be protruded from the first virtual extension line VL11 of the first transparent member 10.

However, arrangement of the external surface 3102 of the first protection portion 311 is not limited thereto, and a portion of the external surface 3102 of the first protection portion 311 may also be arranged at a same position as the first virtual extension line VL11 of the first transparent member 10.

The absorption member 40 is arranged between the first transparent member 10 and the third sidewall 310-3. At least a portion of the absorption member 40 may be arranged to face the side surface 10S of the first transparent member 10.

The interface 50 between the absorption member 40 and the first protection portion 311 may be disposed inward relative to the first virtual extension line VL11. For example, a portion 51 of the interface 50 between the absorption member 40 and the first protection portion 311, which faces the first transparent member 10, may be disposed inward relative to the first virtual extension line VL11. Accordingly, exposure of the interface 50 between the absorption member 40 and the first protection portion 311 to the outside may be prevented.

The portion 51 of the interface 50 between the absorption member 40 and the first protection portion 311, which faces the first transparent member 10, may be arranged to protrude outwardly from the second virtual extension line VL21 virtually extending along an inner surface of the first transparent member 10.

The external surface 3102 of the first protection portion 311 may have a preset curvature. For example, the external surface 3102 of the first protection portion 311 may have a curvature.

A surface of an inner surface of the first protection portion 311 facing the absorption member 40 may include the inclined surface 3108, which is inclined at a preset angle with respect to the rear direction Z2 of the electronic device 1, e.g., greater than 30° and less than 60°.

A surface of the absorption member 40 facing the first protection portion 311 may include an inclined surface 4101 inclined at a preset angle with respect to the rear direction Z2 of the electronic device 1. An angle of the inclined surface 4101 of the absorption member 40 with respect to the rear direction Z2 of the electronic device 1 may be greater than 30° and less than 60°.

The interface 50 between the absorption member 40 and the first protection portion 311 may be inclined at a preset angle θ with respect to the rear direction Z2 of the electronic device 1, and may be greater than 30° and less than 60°.

An angle of the inclined surface 3108 of the inner surface of the first protection portion 311 with respect to the rear direction Z2 of the electronic device 1 may correspond to an angle of the auxiliary side surface 3104 with respect to the rear direction Z2 of the electronic device 1. An angle of the interface 50 between the absorption member 40 and the first protection portion 311 with respect to the rear direction Z2 of the electronic device 1 may correspond to an angle of the auxiliary side surface 3104 with respect to the rear direction Z2 of the electronic device 1. For example, a difference between the angle θ of the interface 50 between the absorption member 40 and the first protection portion 311 with respect to the rear direction Z2 of the electronic device 1 and the angle of the auxiliary side surface 3104 with respect to the rear direction Z2 of the electronic device 1 may be 30° or less.

Although the description above focuses on a structure in which a housing structure surrounds the boundary of the first transparent member 10, the above-described embodiments may also apply to the boundary of the second transparent member 70.

Figure 17:
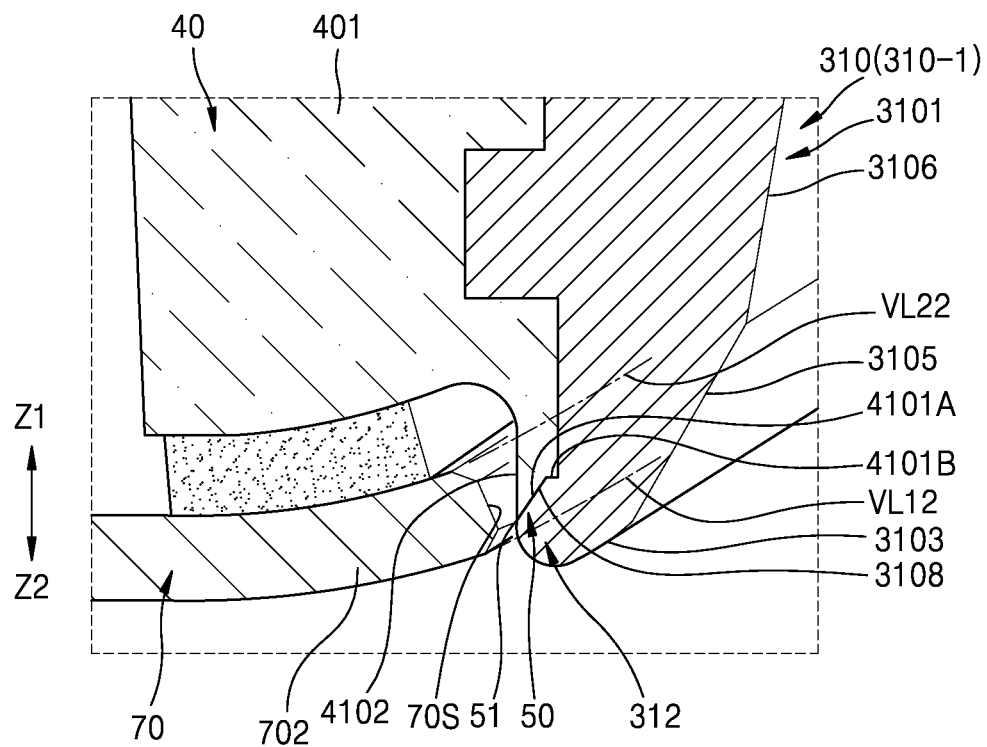
FIG. 17 illustrates an expanded view of a sidewall adjacent to a second transparent member in the electronic device illustrated in FIG. 8 according to an embodiment.

FIG. 17 illustrates an expanded view of a sidewall adjacent to a second transparent member in the electronic device illustrated in FIG. 8 according to an embodiment.

Referring to FIGS. 8 and 17, the absorption member 40 is arranged between the second transparent member 70 and the sidewall 310. At least a portion of the absorption member 40 may be arranged to face the side surface 70S of the second transparent member 70.

The interface 50 between the absorption member 40 and the second protection portion 312 may be disposed inward relative to the first virtual extension line VL12 virtually extending along an external surface of the second transparent member 70. For example, a portion 51 of the interface 50 between the absorption member 40 and the second protection portion 312, facing the second transparent member 70, may be disposed inward relative to the first virtual extension line VL12. Accordingly, exposure of the interface 50 between the absorption member 40 and the second protection portion 312 to the outside may be prevented.

The portion 51 of the interface 50 between the absorption member 40 and the second protection portion 312, facing the second transparent member 70, may be arranged to protrude outwardly from the second virtual extension line VL21 virtually extending along an inner surface of the second transparent member 70.

The external surface 3101 of the sidewall 310 of the housing 30 includes the main side surface 3106, the external surface 3103 of the second protection portion 312, and the auxiliary side surface 3105 arranged between the main side surface 3106 and the external surface 3103 of the second protection portion 312 and at a different angle from the main side surface 3106.

The main side surface 3106 may have a larger area than the auxiliary side surface 3105. An angle of the auxiliary side surface 3105 with respect to the front direction Z1 of the electronic device 1 may be greater than 30° and less than 60°.

The auxiliary side surface 3105 may be formed by using a diamond cutting method. The auxiliary side surface 3105 may have a different gloss from that of the main side surface 3106.

An inner surface of the second protection portion 312 may include the inclined surface 3108 that is inclined at a preset angle θ with respect to the front direction Z1 of the electronic device 1, and may be greater than 30° and less than 60°.

A surface of the absorption member 40 facing the second protection portion 312 includes the inclined surface 4101A that is inclined at a preset angle with respect to the front direction Z1 of the electronic device 1, and may be greater than 30° and less than 60°.

The interface 50 between the absorption member 40 and the second protection portion 312 may be inclined at a preset angle θ with respect to the front direction Z1 of the electronic device 1, and may be greater than 30° and less than 60°.

In the housing 30, because an inner surface of the second protection portion 312 has the inclined surface 3108 that is inclined with respect to the front direction Z1 of the electronic device 1, and the interface 50 between the absorption member 40 and the second protection portion 312 is inclined at a preset angle with respect to the front direction Z1 of the electronic device 1, the second protection portion 312 may have a thickness that prevents bending or damage.

The absorption member 40 may be arranged inside the housing 30 by using an insert injection method. Accordingly, a surface of the absorption member 40 facing the sidewall 310 of the housing 30 and a surface of the sidewall 310 of the housing 30 facing the absorption member 40, may have corresponding shapes. For example, a surface of the absorption member 40 facing the sidewall 310 of the housing 30 and a surface of the sidewall 310 of the housing 30, which faces the absorption member 40, may have identical shapes.

The inclined surface 3108 of the inner surface of the second protection portion 312 may have a shape corresponding to a shape of the external surface 3101 of the sidewall 310. The shape of the interface 50 between the absorption member 40 and the second protection portion 312 may have a shape corresponding to the shape of the external surface 3101 of the sidewall 310.

An angle of the inclined surface 3108 of the inner surface of the second protection portion 312 with respect to the front direction Z1 of the electronic device 1 may correspond to an angle of the auxiliary side surface 3105 with respect to the front direction Z1 of the electronic device 1. An angle of the interface 50 between the absorption member 40 and the second protection portion 312 with respect to the front direction Z1 of the electronic device 1 may correspond to an angle of the auxiliary side surface 3105 with respect to the front direction Z1 of the electronic device 1. For example, a difference between the angle of the interface 50 between the absorption member 40 and the second protection portion 312 with respect to the front direction Z1 of the electronic device 1 and the angle of the auxiliary side surface 3105 with respect to the front direction Z1 of the electronic device 1 may be less than or equal to 30°.

The surface 4102 of the absorption member 40 facing the side surface 70S of the second transparent member 70 may be parallel to the directions of the front and rear directions Z1 and Z2 of the electronic device 1.

Referring back to FIG. 8, the absorption member 40 further includes an area 401 between the first transparent member 10 and the second transparent member, in addition to an area that faces the side surfaces 10S and 70S of the first and second transparent members 10 and 70 and contacts the sidewall 310. The area 401 of the absorption member 40 between the first transparent member 10 and the second transparent member 70 may be adhered to the first transparent member 10 and the second transparent member 70. However, the shape of the absorption member 40 is not limited thereto, and may be modified in various manners.

Figure 18:
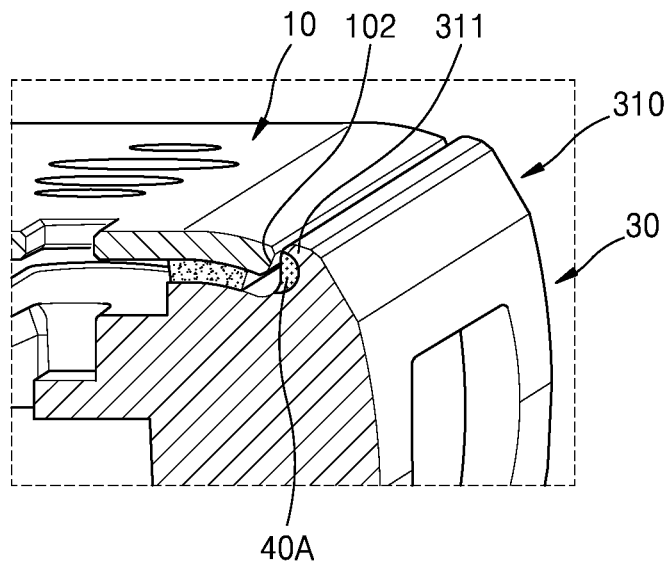
FIG. 18 illustrates a housing structure of an electronic device according to an embodiment.

FIG. 18 illustrates a housing structure of an electronic device according to an embodiment.

Referring to FIG. 18, an absorption member 40A includes only an area that faces the side surfaces 10S and 70S of the first and second transparent members 10 and 70 and contacts the sidewall 310, and omits an area between the first transparent member 10 and the second transparent member 70.

According to the electronic device and the housing structure of the embodiment, aesthetic sense may be provided, and also, cracks or damage in or to a window glass or a rear glass may be prevented.

It should be understood that embodiments described herein should be considered in a descriptive sense only and not for purposes of limitation. Descriptions of features or aspects within each embodiment should typically be considered as available for other similar features or aspects in other embodiments.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. An electronic device, comprising:
   a transparent member arranged on at least one of a front surface and a rear surface of the electronic device;
   a metallic housing surrounding a boundary of the transparent member, and forming a lateral outer appearance of the electronic device; and
   a non-metallic absorption member arranged inside the metallic housing,
   wherein at least a portion of the non-metallic absorption member is arranged to face a side surface of the transparent member,
   wherein the metallic housing comprises a protection portion arranged adjacent to the boundary of the transparent member,
   wherein a portion of an interface between the non-metallic absorption member and the protection portion, which faces the transparent member, is disposed inward relative to a first virtual extension line virtually extending along an external surface of the transparent member, and
   wherein an inner surface of the protection portion facing the non-metallic absorption member includes a surface inclined at a preset angle with respect to a front or rear direction of the electronic device.

2. The electronic device of claim 1, wherein the transparent member comprises:
   a first area providing a planar surface; and
   a second area arranged around a boundary of the first area and providing a curved surface,
   wherein the protection portion surrounds a boundary of the second area, and an external surface of the protection portion is curved.

3. The electronic device of claim 1, wherein the preset angle is greater than 30° and less than 60°.

4. The electronic device of claim 1, wherein the non-metallic absorption member is arranged inside the metallic housing by using an insert injection method.

5. The electronic device of claim 1, wherein a surface of the non-metallic absorption member facing the metallic housing and a surface of the metallic housing facing the non-metallic absorption member have corresponding shapes.

6. The electronic device of claim 1, wherein an angle of the interface between the non-metallic absorption member and the protection portion with respect to the front direction or the rear direction of the electronic device is greater than 30° and less than 60°.

7. The electronic device of claim 1, wherein the portion of the interface between the non-metallic absorption member and the protection portion, which faces the transparent member, protrudes from a second virtual extension line virtually extending along an inner surface of the transparent member.

8. The electronic device of claim 1, wherein a portion of an external surface of the protection portion protrudes from the first virtual extension line or at a same position as the first virtual extension line, such that the protection portion protects the transparent member.

9. The electronic device of claim 1, wherein an external surface of the metallic housing comprises:
   a main side surface;
   an external surface of the protection portion; and an auxiliary side surface that is arranged between the main side surface and the external surface of the protection portion and is formed at a different angle from the main side surface.

10. The electronic device of claim 9, wherein the preset angle corresponds to an angle of the auxiliary side surface with respect to the front direction or the rear direction of the electronic device.

11. The electronic device of claim 9, wherein the auxiliary side surface has a different gloss than the main side surface.

12. The electronic device of claim 1, wherein a surface of the non-metallic absorption member facing the protection portion includes an inclined surface having a preset inclination angle with respect to the front direction or the rear direction of the electronic device and an extended surface having a greater inclination angle than the inclined surface.

13. The electronic device of claim 1, wherein the metallic housing comprises at least one of stainless steel, an aluminum alloy, or a magnesium alloy.

14. The electronic device of claim 1, wherein the non-metallic absorption member comprises a plastic, a resin, a rubber, or a mixture thereof.

15. The electronic device of claim 1, further comprising a display panel,
wherein the transparent member is arranged in front of the display panel.

16. The electronic device of claim 15, wherein the inclined surface is inclined at a preset angle with respect to the rear direction of the electronic device.

17. The electronic device of claim 1, further comprising a rear case arranged at a rear direction of the metallic housing,
wherein the transparent member is arranged at a rear direction of the rear case.

18. The electronic device of claim 17, wherein the surface is inclined at the preset angle with respect to the front direction of the electronic device.

19. A housing structure of an electronic device in which a transparent member is arranged on at least one of a front surface and a rear surface of the electronic device, the housing structure comprising:
a metallic boundary of the transparent member, forming a lateral outer appearance of the electronic device; and
a non-metallic absorption member arranged inside the housing structure,
wherein at least a portion of the non-metallic absorption member is arranged to face a side surface of the transparent member,
wherein a portion of the metallic boundary comprises a protection portion arranged adjacent to a boundary of the transparent member,
wherein a portion of the interface between the non-metallic absorption member and the protection portion, which faces the transparent member, is disposed inward relative to a first virtual extension line virtually extending along an external surface of the transparent member, and
wherein an inner surface of the protection portion facing the non-metallic absorption member includes a surface inclined at a preset angle with respect to a front or rear direction of the electronic device.

20. The housing structure of claim 19, wherein the preset angle is greater than 30° and less than 60°.

* * * * *